US009960144B2

(12) United States Patent
Nagahama et al.

(10) Patent No.: US 9,960,144 B2
(45) Date of Patent: May 1, 2018

(54) METHOD FOR HEATING A METAL MEMBER, METHOD FOR BONDING HEATED METAL MEMBERS, AND APPARATUS FOR HEATING A METAL MEMBER

(71) Applicant: JTEKT Corporation, Osaka-shi (JP)

(72) Inventors: Takaya Nagahama, Obu (JP); Koichi Shiiba, Nisshin (JP); Yoshinori Imoto, Kariya (JP)

(73) Assignee: JTEKT CORPORATION, Osaka-shi (JP)

( * ) Notice: Subject to any disclaimer, the term of this patent is extended or adjusted under 35 U.S.C. 154(b) by 0 days. days.

(21) Appl. No.: 15/292,598

(22) Filed: Oct. 13, 2016

(65) Prior Publication Data
US 2017/0110435 A1 Apr. 20, 2017

(30) Foreign Application Priority Data

Oct. 15, 2015 (JP) .................................. 2015-203686
Feb. 4, 2016 (JP) .................................. 2016-019936

(51) Int. Cl.
*H01L 21/66* (2006.01)
*H01L 23/00* (2006.01)
*H01L 21/48* (2006.01)
*H01L 21/67* (2006.01)

(52) U.S. Cl.
CPC .......... *H01L 24/85* (2013.01); *H01L 21/4885* (2013.01); *H01L 21/67115* (2013.01); *H01L 22/10* (2013.01); *H01L 2224/485* (2013.01); *H01L 2924/01029* (2013.01)

(58) Field of Classification Search
CPC ................. H01L 24/85; H01L 21/4885; H01L 21/67115; H01L 22/10
See application file for complete search history.

(56) References Cited

U.S. PATENT DOCUMENTS

| | | | |
|---|---|---|---|
| 6,407,012 B1 * | 6/2002 | Miyasaka | ............... C23C 14/10 257/E21.279 |
| 2004/0248388 A1 * | 12/2004 | Yamazaki | .......... B23K 26/0643 438/487 |
| 2017/0291259 A1 * | 10/2017 | Imoto | .................. B23K 26/211 |

FOREIGN PATENT DOCUMENTS

| | | |
|---|---|---|
| JP | 4894528 | 3/2012 |
| JP | 5602050 | 10/2014 |
| JP | 2014-228478 | 12/2014 |

* cited by examiner

*Primary Examiner* — Kyoung Lee
*Assistant Examiner* — Christina Sylvia
(74) *Attorney, Agent, or Firm* — Oblon, McClelland, Maier & Neustadt, L.L.P.

(57) ABSTRACT

A heating method includes an oxide film forming step and a heating step. The thickness of an oxide film is set in a first range that includes a first maximal thickness and a second maximal thickness and that is smaller than a second minimal thickness in the relationship with the laser absorption having a periodic profile. The first maximal thickness corresponds to a first maximal value a of the laser absorption. The second maximal thickness corresponds to a second maximal value of the laser absorption. The second minimal thickness corresponds to a second minimal value of the laser absorption, namely the minimal value of the laser absorption that appears between the second maximal value and a third maximal value, or the maximal value of the laser absorption that appears subsequent to the second maximal value.

16 Claims, 16 Drawing Sheets

METHOD FOR HEATING A METAL
MEMBER, METHOD FOR BONDING
HEATED METAL MEMBERS, AND
APPARATUS FOR HEATING A METAL
MEMBER

INCORPORATION BY REFERENCE

The disclosures of Japanese Patent Applications No. 2015-203686 and No. 2016-019936 respectively filed on Oct. 15, 2015 and Feb. 4, 2016, each including the specification, drawings and abstract are incorporated herein by reference in their entireties.

BACKGROUND OF THE INVENTION

1. Field of the Invention

The present invention relates to methods for heating a metal member by laser light, methods for bonding heated metal members, and apparatuses for heating a metal member.

2. Description of the Related Art

Conventionally, there is a technique of heating a metal member by irradiating the surface of the metal member with laser light and causing the metal member to absorb the laser light. See, e.g., Japanese Patent No. 4894528 and No. 5602050, and Japanese Patent Application Publication No. 2014-228478 (JP 2014-228478 A).

Metal members are heated for various purposes. One of the purposes is to bond two members, as described in, e.g., Japanese Patent No. 4894528 and No. 5602050. For example, in the case of bonding two members, a metal member (e.g., a lead wire) that serves as a contact of an electric circuit is heated to directly bond the metal member to a member to which the metal member is to be bonded (e.g., a terminal of a semiconductor device). In this case, as described in Japanese Patent No. 4894528 and No. 5602050, a portion to be heated may not be heated until it forms a liquid phase. Namely, heating may be stopped while the portion is still in a solid phase, and the metal member and the member to which the metal member is to be bonded may be pressed and bonded together with a predetermined pressure (solid-phase diffusion bonding). Alternatively, these members may be bonded by normal welding. Namely, the portion to be heated may be melted into a liquid phase, and the metal member and the member to which the metal member is to be bonded may be bonded together. This bonding is more resistant to high temperature environments than in the case where the metal member and the member to which the metal member is to be bonded are bonded by, e.g., solder.

Another purpose of heating is to nondestructively examine if a metal member and a member having the metal member bonded thereto have been bonded with a sufficient contact area, as described in, e.g., JP 2014-228478 A. In the technique of JP 2014-228478 A, the metal member bonded to the member is irradiated with laser light to heat the metal member, so that the temperature of the metal member rises. If the metal member and the member have been bonded with a sufficient contact area, the heat is satisfactorily transferred from the metal member to the member according to the contact area, and the temperature of the metal member therefore rises slowly. However, if the metal member and the member have been insufficiently bonded with an insufficient contact area, the heat of the metal member cannot be satisfactorily transferred to the member, and the temperature of the metal member therefore rises sharply. The bonded state between the metal member and the member is evaluated by this difference in rate of temperature rise.

In the above description, an inexpensive yttrium aluminum garnet (YAG) laser etc. is often used to emit laser light. YAG lasers are lasers that emit near-infrared laser light (0.7 μm to 2.5 μm). For example, YAG laser absorption of metal members made of copper or aluminum is very low at low temperatures up to a predetermined temperature (e.g., a melting point). Accordingly, if the metal member described in the technique of Japanese Patent No. 4894528, Japanese Patent No. 5602050, or JP 2014-228478 A is made of copper or aluminum, even if the metal member is directly irradiated with laser light, the temperature of the metal member rises slowly in a low temperature range due to its low laser absorption. A large amount of energy is therefore consumed until the temperature of the metal member reaches the predetermined temperature at which the laser absorption of the metal member increases.

As a solution to this, in the technique described in JP 2014-228478 A, laser absorption of the metal member at low temperatures is enhanced by forming an oxide film on the surface of the metal member, based on the known knowledge. The oxide film is formed by irradiating the surface of the metal member with oxide film formation laser light (laser light for forming an oxide film). That is, the surface of the metal member is irradiated with laser light for a predetermined time in order to form an oxide film with a predetermined thickness that implements desired laser absorption. The metal member is then irradiated with heating laser light (laser light for heating) through the oxide film formed on the surface of the metal member. Since the metal member has enhanced laser absorption due to formation of the oxide film, the temperature of the metal member rises quickly, whereby efficient evaluation of the bonded state is achieved. It is known that laser absorption is saturated when the thickness of the oxide film is larger than a certain value. In the technique described in JP 2014-228478 A, the thickness of the oxide film at which laser absorption is saturated is set based on this knowledge, and the laser irradiation time is set so that the oxide film having this thickness can be formed.

However, it takes too long to form an oxide film with a certain thickness or more at which laser absorption is saturated as described in JP 2014-228478 A, which causes an increase in cost. Moreover, if the laser irradiation time is reduced in order to form an oxide film in a short time, the thickness of the oxide film is reduced. In the relationship with the thickness of a thin oxide film that has a near-zero thickness and can be formed by short-time irradiation with laser light, the laser absorption of the metal member has a periodic profile with maximal and minimal values appearing alternately as the thickness of the oxide film increases from zero. In this case, even a slight variation in thickness of the oxide film causes a great variation in laser absorption. Accordingly, forming a thin oxide film by the short-time laser irradiation is inexpensive, but stable laser absorption is less likely to be achieved.

SUMMARY OF THE INVENTION

It is one object of the present invention to provide a heating method for heating a metal member, a method for bonding heated metal members, and an apparatus for heating a metal member, which can stably and efficiently heat a metal member by enhancing laser absorption by a thin oxide film that can be formed at low cost.

According to one aspect of the present invention, a heating method for heating a metal member by irradiation with heating laser light includes: an oxide film forming step of forming an oxide film with a predetermined thickness on a surface of the metal member; and a heating step of irradiating the metal member with the heating laser light through the oxide film and causing the metal member to absorb the heating laser light with absorption corresponding to the predetermined thickness of the oxide film to heat the metal member to a predetermined temperature.

The absorption has such characteristics that, in a relationship with a thickness of the oxide film, the absorption has a periodic profile with maximal and minimal values appearing alternately as the thickness increases, and that the absorption is the lowest when the thickness of the oxide film is zero, and the predetermined thickness of the oxide film that is formed with a thickness larger than zero in the oxide film forming step is set in a first range that includes a first maximal thickness and a second maximal thickness and that is smaller than a second minimal thickness in the relationship with the absorption having the periodic profile, the first maximal thickness corresponds to a first maximal value of the absorption, or the maximal value of the absorption that first appears after the thickness of the oxide film increases from zero, the second maximal thickness corresponds to a second maximal value of the absorption, or the maximal value of the absorption that appears subsequent to the first maximal value, and the second minimal thickness corresponds to a second minimal value of the absorption, or the minimal value of the absorption that appears between the second maximal value and a third maximal value, or the maximal value of the absorption that appears subsequent to the second maximal value.

As described above, the absorption of the heating laser light by the metal member has such characteristics that, in the relationship with the thickness of the oxide film, the absorption has a periodic profile with maximal and minimal values appearing alternately, and that the absorption is the lowest when the thickness of the oxide film is zero. The thickness of the oxide film of the metal member is set in the first range that includes the first maximal thickness and the second maximal thickness and that is smaller than the second minimal thickness. The first maximal thickness corresponds to the first maximal value of the absorption that appears after the thickness of the oxide film increases from zero. The second maximal thickness corresponds to the second maximal value of the absorption that appears subsequent to the first maximal value. The second minimal thickness corresponds to the second minimal value of the absorption, or the minimal value of the absorption that appears between the second maximal value and the third maximal value, or the maximal value of the absorption that appears subsequent to the second maximal value. The thickness of the oxide film can thus be set in the wide range (first range) based on the relationship between the thickness of the oxide film and the absorption having the periodic profile. Accordingly, even if the thickness of the oxide film varies slightly when the film is formed, the absorption of the heating laser light can be reliably increased and the metal member can be stably and efficiently heated as compared to the case where the metal member is irradiated with the heating laser light without through the oxide film. Since the thickness of the oxide film is limited to the first range near zero, the oxide film is not formed with a thickness larger than the first range. This restrains an increase in cost caused by the excessive amount of time required to form the oxide film with a thickness larger than the first range.

According to another aspect of the present invention, in a method for bonding a first bonding surface of a metal member that is opposite to a surface of the metal member and a second bonding surface that contacts the first bonding surface, or the second bonding surface of another metal member to which the metal member is to be bonded, the metal members are heated to the predetermined temperature by the heating method of the above aspect so that the first bonding surface and the second bonding surface form a solid phase that is formed at a temperature lower than that of a liquid phase and that allows bonding to be achieved in a solid state, and the first bonding surface and the second bonding surface are pressed and bonded together in a pressure-bonding direction.

As described above, the first bonding surface and the second bonding surface are heated to the solid phase, or to a temperature lower than that at which the metal member is melted, and are bonded together. Accordingly, a required amount of irradiation with the heating laser light is reduced as compared to the case where the metal member is melted for bonding. Moreover, the oxide film is formed on the metal member to improve the absorption of the heating laser light. Accordingly, the amount of energy of the heating laser light to be used can be significantly reduced, and cost for bonding can be reduced.

According to still another aspect of the present invention, a heating apparatus for heating a metal member by irradiation with heating laser light includes: an oxide film forming unit that forms an oxide film with a predetermined thickness on a surface of the metal member; and a heating unit that irradiates the metal member with the heating laser light through the oxide film formed with the predetermined thickness and causes the metal member to absorb the heating laser light with absorption corresponding to the predetermined thickness of the oxide film to heat the metal member to a predetermined temperature. The absorption has such characteristics that, in a relationship with a thickness of the oxide film, the absorption has a periodic profile with maximal and minimal values appearing alternately as the thickness increases direction, and that the absorption is the lowest when the thickness of the oxide film is zero. The predetermined thickness of the oxide film that is formed with a thickness larger than zero by the oxide film forming unit is set in a first range that includes a first maximal thickness and a second maximal thickness and that is smaller than a second minimal thickness in the relationship with the absorption having the periodic profile. The first maximal thickness corresponds to a first maximal value of the absorption, or the maximal value of the absorption that first appears after the thickness of the oxide film increases from zero. The second maximal thickness corresponds to a second maximal value of the absorption, or the maximal value of the absorption that appears subsequent to the first maximal value. The second minimal thickness corresponds to a second minimal value of the absorption, or the minimal value of the absorption that appears between the second maximal value and a third maximal value, or the maximal value of the absorption that appears subsequent to the second maximal value. This heating apparatus can perform stable, efficient heating.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

Figure 1:
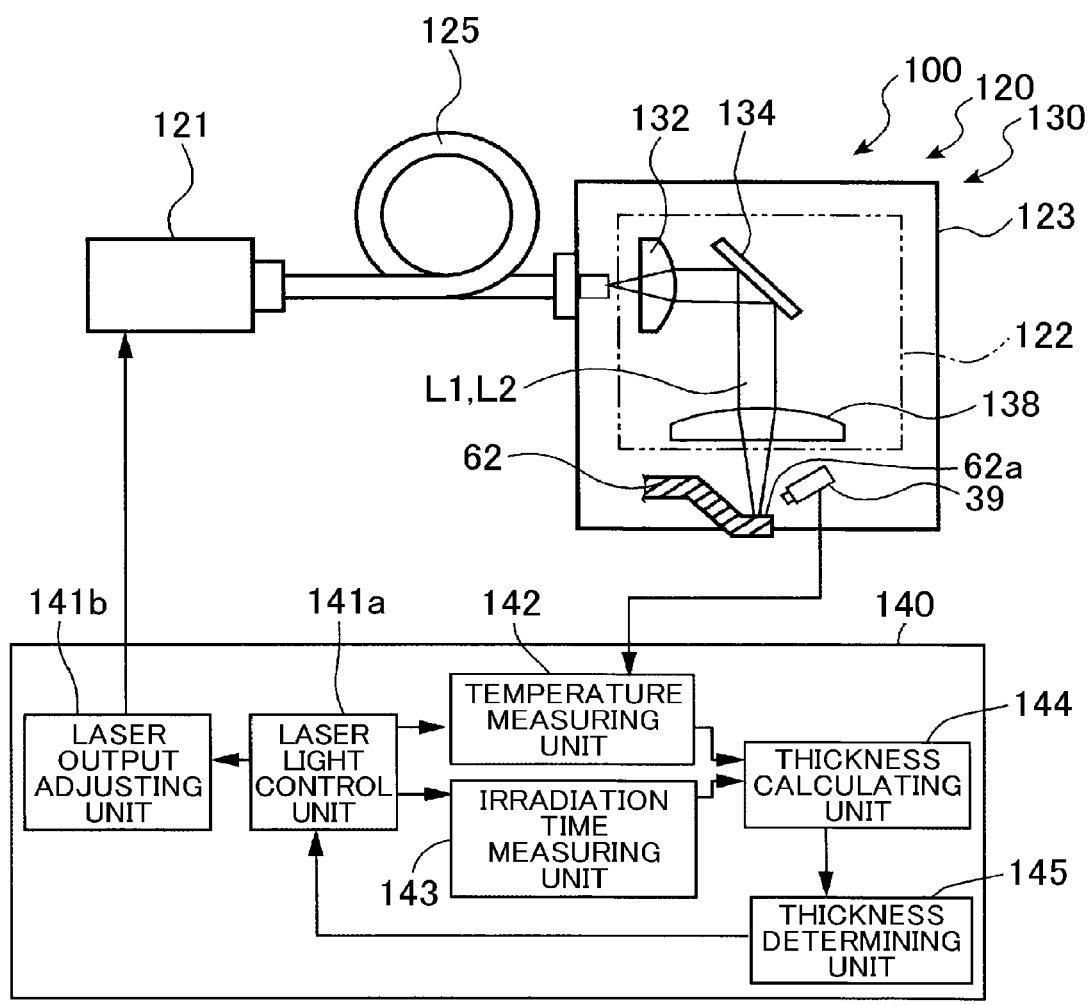
FIG. 1 is a schematic diagram of a heating apparatus according to a first embodiment.

An apparatus for heating a metal member according to a first embodiment of the present invention will be described with reference to the accompanying drawings. FIG. 1 is a schematic diagram of a heating apparatus 100. The heating apparatus 100 is an apparatus that irradiates a metal member (lead frame 62) of, e.g., copper etc., whose laser absorption is low at low temperatures equal to or lower than its melting point and whose temperature thus does not rise efficiently at the low temperatures, with near-infrared laser light like a YAG laser to cause the metal member to absorb the laser light with higher absorption than in conventional examples to efficiently heat the metal member and raise the temperature of the metal member. The metal member heated by the heating apparatus 100 can be used in any applications. In the present embodiment, heating the metal member (lead frame 62) in order to bond the metal member (lead frame 62) to a metal member to which the metal member (lead frame 62) is to be bonded (a metal terminal on the surface of a semiconductor component 50) will be described later as an example of the applications.

First, the heating apparatus 100 will be described. As shown in FIG. 1, the heating apparatus 100 includes an oxide film forming unit 120, a heating unit 130, and a control unit 140. The oxide film forming unit 120 forms an oxide film OM with a predetermined thickness α (see FIG. 2) on the surface of the lead frame 62 (metal member). The predetermined thickness α is a desired thickness that enhances laser absorption of the lead frame 62 than before.

The term "before" refers to the state where the oxide film OM has not been formed on the surface of the lead frame 62 (metal member). Setting of the predetermined thickness α will be described in detail later. The oxide film forming unit 120 includes a laser oscillator 121, a laser head 122, and a housing 123. The laser head 122 is placed in the housing 123. The oxide film forming unit 120 further includes a laser light control unit 141a, a laser output adjusting unit 141b, a temperature measuring unit 142, an irradiation time measuring unit 143, a thickness calculating unit 144, and a thickness determining unit 145 that are included in the control unit 140 described below.

The laser oscillator 121 is a laser oscillator that can emit a continuous wave CW (see the conceptual diagram of FIG. 2) at different output levels by a switching operation that is performed by the control unit 140. The continuous wave CW is laser light that is continuously emitted without interruption. In the present embodiment, the laser oscillator 121 emits the continuous wave CW at two output levels. The high output level is a continuous wave CW1, and the low output level that is lower than the continuous wave CW1 is a continuous wave CW2. The laser oscillator 121 produces these two output levels, namely the continuous wave CW1 and the continuous wave CW2, by output adjustment that is made by the laser output adjusting unit 141b. In the present embodiment, the continuous wave CW1 is oxide film formation laser light, and the continuous wave CW2 is heating laser light that will be described in detail below.

If the output of the continuous wave CW1 is, e.g., 100 W, the output of the continuous wave CW2 is, e.g., about 20 W. However, these output values are shown by way of example only, and are not limited to these values. When forming the oxide film OM with the predetermined thickness α at a surface 62a (the upper surface in FIG. 1) of the lead frame 62 (metal member), the surface 62a is irradiated with the continuous wave CW1 by operation of the oxide film forming unit 120.

When heating the lead frame 62 (metal member), the surface 62a of the lead frame 62 is irradiated with the continuous wave CW2 through the oxide film OM formed on the surface 62a by operation of the heating unit 130 described in detail later. In the present embodiment, the continuous waves C1, C2 are the same kind of laser light that is emitted by the same device (the laser oscillator 121 and the laser head 122) to the surface 62a of the lead frame 62. The continuous waves C1, C2 are different in output but have the same wavelength. The continuous wave CW1 is hereinafter referred to as the "oxide film formation laser light L1" and the continuous wave CW2 as the "heating laser light L2."

The laser oscillator 121 of the oxide film forming unit 120 produces the oxide film formation laser light L1 by oscillation at a predetermined wavelength according to the type of laser light. It is preferable that the wavelength of the oxide film formation laser light L1 (continuous wave CW1) be in the range of 0.7 μm to 2.5 μm. That is, it is preferable that the oxide film formation laser light L1 be near-infrared laser light that is emitted by lasers such as a YAG laser.

Accordingly, the laser oscillator 121 can be produced inexpensively. Specifically, the oxide film formation laser light L1 can be holmium YAG (HoYAG) (wavelength: about 1.5 μm), yttrium vanadate (YVO) (wavelength: about 1.06 μm), ytterbium (Yb) (wavelength: about 1.09 μm), fiber laser light, etc. The laser oscillator 121 includes an optical fiber 125 that transmits the oxide film formation laser light L1 from the laser oscillator 121 to the laser head 122.

As shown in FIG. 1, the laser head 122 placed in the housing 123 is disposed so as to face the surface 62*a* of the lead frame 62 at a predetermined distance from the surface 62*a* of the lead frame 62. The laser head 122 has a collimating lens 132, a mirror 134, and an fθ lens 138. The collimating lens 132 collimates the oxide film formation laser light L1 emitted from the optical fiber 125 into a parallel beam.

The mirror 134 changes the direction in which the oxide film formation laser light L1 travels so that the collimated oxide film formation laser light L1 is incident on the fθ lens 138. In the present embodiment, the mirror 134 changes the direction in which the oxide film formation laser light L1 travels by 90 degrees. The fθ lens 138 is a lens that collects the incident collimated oxide film formation laser light L1 from the mirror 134.

In the present embodiment, the surface 62*a* of the lead frame 62 is continuously irradiated with the oxide film formation laser light L1 with its optical axis perpendicular to the surface 62*a* of the lead frame 62. The oxide film OM is formed on the surface 62*a* of the lead frame 62 by this continuous irradiation with the oxide film formation laser light L1 (see the graph of FIG. 3). As the irradiation time H increases, the oxide film OM gradually grows such that the thickness of the oxide film OM increases. For example, the oxide film OM is formed with the predetermined thickness α (larger than zero) in a circular region with a diameter of about 200 μm about the optical axis of the laser light L1.

Figure 4:
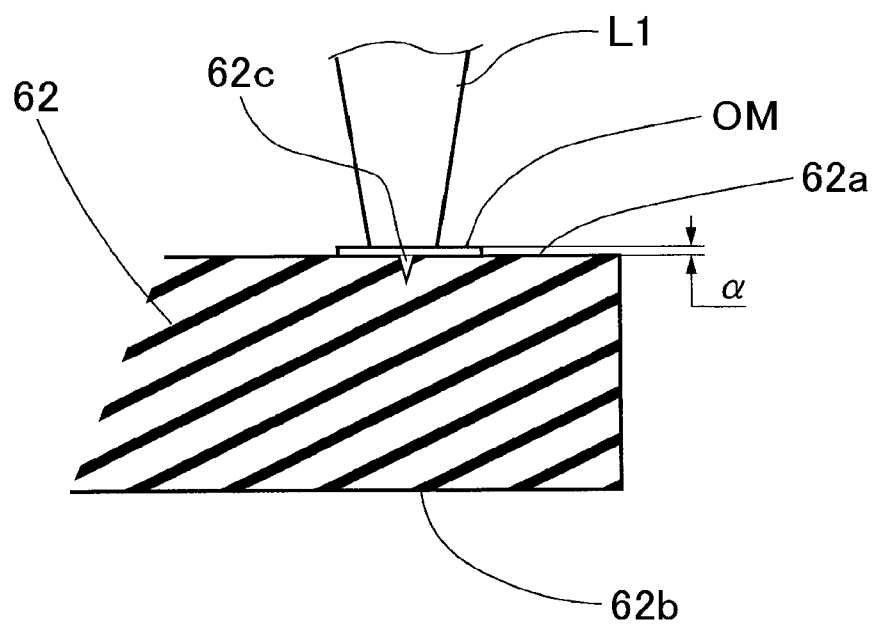
FIG. 4 is a diagram showing the oxide film formed on the surface of the metal member and a hole formed in the surface of the metal member by irradiation with the oxide film formation laser light.

At this time, a hole 62*c* with a very small opening diameter is formed in the surface 62*a* (irradiated position) of the lead frame 62 irradiated with the oxide film formation laser light L1 (see FIG. 4). For example, the opening diameter of the hole 62*c* is about 10 μm. The shape (diameter etc.) of the hole 62*c* is determined according to the profile of the oxide film formation laser light L1.

The profile of laser light refers to the radiation diameter (spot diameter) and the spatial intensity distribution that are specific to the laser light. When the surface 62*a* is irradiated with the oxide film formation laser light L1, the hole 62*c* according to the profile of the oxide film formation laser light L1 at that time is formed in the surface 62*a*. The specification of the profile may be set so that the hole 62*c* is not formed in the surface 62*a* even if the surface 62*a* is irradiated with the oxide film formation laser light L1. The profile of the oxide film formation laser light L1 can be set as desired by changing the lens configuration such as the shape and positioning of the lens.

When the surface 62*a* is irradiated with the heating laser light L2 (continuous wave CW2) by the heating unit 130 described below, a part of the heating laser light L2 enters the hole 62*c*. The part of the heating laser light L2 that has entered the hole 62*c* strikes the side surface of the hole 62*c* and is absorbed while being irregularly reflected by the side surface of the hole 62*c*. The laser light thus absorbed is converted to heat, which contributes to an increase in temperature of the lead frame 62. As described above, the opening diameter of the hole 62*c* formed in the surface 62*a* is, e.g., about 10 μm, and the depth of the hole 62*c* is about 5 μm. However, this is by way of example only. The opening diameter and the depth of the hole 62*c* are not limited to these values, and may be any values.

Figure 2:
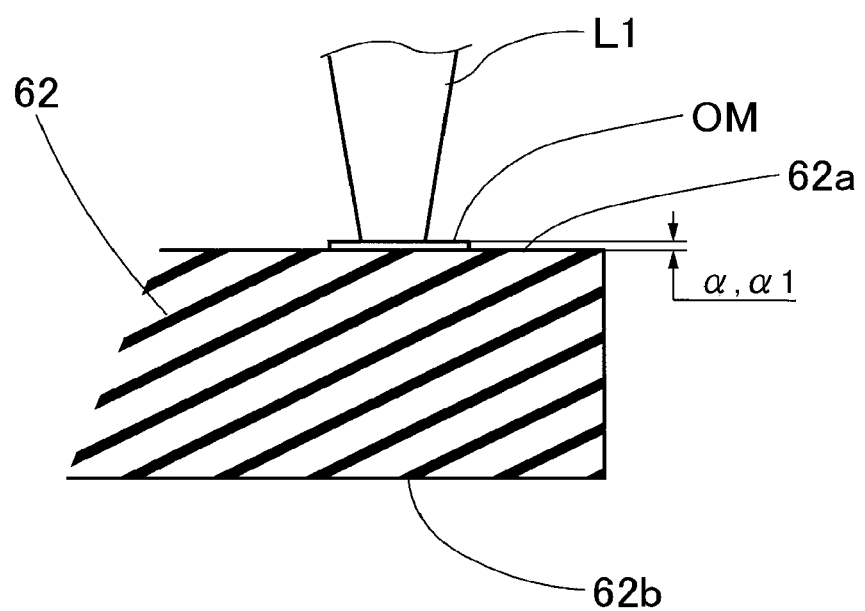
FIG. 2 is a conceptual diagram showing irradiation of a metal member with laser light that is a continuous wave, and an oxide film that is formed on a surface of the metal member by the irradiation.
Figure 5:
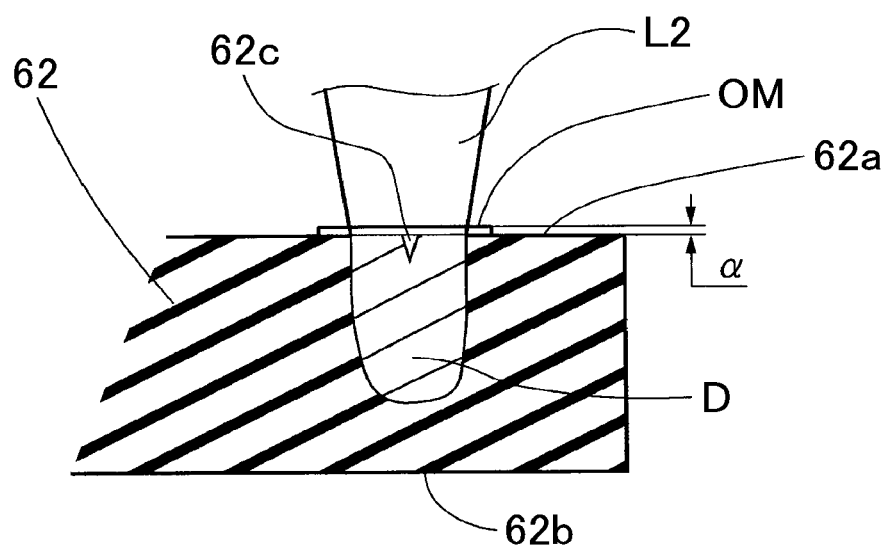
FIG. 5 is a conceptual diagram showing the metal member being heated from its surface by irradiation with heating laser light.

The heating unit 130 emits the heating laser light L2 (continuous wave CW2) toward the oxide film OM formed on the surface 62*a* of the lead frame 62 (metal member) by the oxide film forming unit 120 to heat the lead frame 62 (see FIGS. 2 and 5). As described above, the heating laser light L2 is the same kind of laser light as the oxide film formation laser light L1 and is only smaller in output than the oxide film formation laser light L1.

The heating laser light L2 transmits through or is reflected by the oxide film OM with the predetermined thickness α, and is efficiently absorbed by the surface 62*a* of the lead frame 62 and the hole 62*c*, thereby satisfactorily heating the lead frame 62. Specifically, the heating laser light L2 heats the lead frame 62 so that heat is transmitted from the surface 62*a* to the back surface (corresponding to the first bonding surface 62*b* described below) of the lead frame 62 that is opposite to the surface 62*a*. The heating laser light L2 eventually heats the first bonding surface 62*b* to a desired temperature.

The portion D in FIG. 5 conceptually shows that the lead frame 62 is being heated from the surface 62*a* toward the first bonding surface 62*b*. Transfer of the heat is shown by slanting lines thinner than those showing the section of the lead frame 62.

The function of the oxide film OM to enhance absorption of the heating laser light L2 by the lead frame 62 is based on the known knowledge. Description of the principle etc. that brings about the effect will be omitted. As described in detail later, absorption of the heating laser light L2 by the lead frame 62 varies according to the thickness of the oxide film OM (see the graph of FIG. 6). The predetermined thickness α of the oxide film OM that is formed by the oxide film forming unit 120 is set so that the heating laser light L2 can be more efficiently absorbed by the lead frame 62.

As described above, the heating laser light L2 that is emitted by the heating unit 130 to the oxide film OM formed on the surface 62*a* of the lead frame 62 (metal member) is the continuous wave CW2 whose output is different from (lower than) that of the oxide film formation laser light L1 (continuous wave CW1). The laser oscillator 121 changes the output of the oxide film formation laser light L1 to the output of the heating laser light L2 in response to a command of the laser output adjusting unit 141*b* of the control unit 140 described in detail below, whereby the heating laser light L2 is emitted. The heating unit 130 has a configuration similar to that of the oxide film forming unit 120 except for the irradiation time measuring unit 143, the thickness calculating unit 144, and the thickness determining unit 145 of the oxide film forming unit 120.

The control unit 140 is a control device that controls operation of the oxide film forming unit 120 and the heating unit 130. As shown in FIG. 1, the control unit 140 includes the laser light control unit 141*a*, the laser output adjusting unit 141*b*, the temperature measuring unit 142, the irradiation time measuring unit 143, the thickness calculating unit 144, and the thickness determining unit 145 that control operation of the oxide film forming unit 120. As described above, the laser light control unit 141*a*, the laser output adjusting unit 141*b*, the temperature measuring unit 142, the irradiation time measuring unit 143, the thickness calculating unit 144, and the thickness determining unit 145 are included in the oxide film forming unit 120.

The control unit 140 includes the laser light control unit 141*a*, the laser output adjusting unit 141*b*, and the temperature measuring unit 142 that control operation of the heating unit 130. The laser light control unit 141a, the laser output adjusting unit 141b, and the temperature measuring unit 142 are provided for both the oxide film forming unit 120 and the heating unit 130 and are also included in the heating unit 130.

The laser light control unit 141a controls the laser output adjusting unit 141b to change the output of laser light that is produced by the laser oscillator 121. That is, the laser light control unit 141a controls the laser output adjusting unit 141b to selectively irradiate the surface 62a of the lead frame 62 (metal member) with the oxide film formation laser light L1 (continuous wave CW1) or the heating laser light L2 (continuous wave CW2).

Specifically, the laser light control unit 141a sends a target output value of the laser light to be emitted to the laser output adjusting unit 141b. The laser output adjusting unit 141b controls the laser oscillator 121 so that the laser oscillator 121 oscillates with the target output value designated by the laser light control unit 141a to produce desired laser light (e.g., the oxide film formation laser light L1) and continuously irradiate the surface 62a with the laser light.

Figure 3:
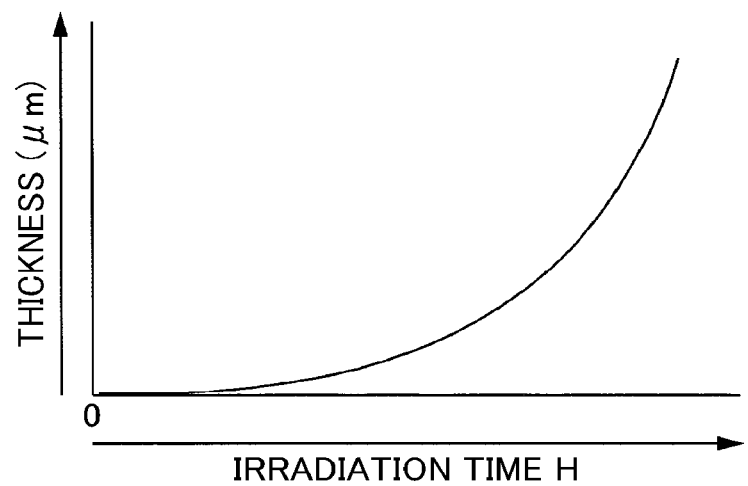
FIG. 3 is a graph showing an example of a process in which the oxide film is formed on the surface of the metal member by irradiation with oxide film formation laser light.

With this irradiation with the laser light (see FIG. 2), the temperature of the surface 62a of the lead frame 62 rises, and the oxide film OM is formed with a thickness according to the irradiation time H shown in the graph of FIG. 3. In the graph of FIG. 3, the abscissa represents the irradiation time H and the ordinate represents the thickness of the oxide film OM that is formed on the surface 62a of the lead frame 62. The graph of FIG. 3 is shown by way of example only and may have different characteristics.

The thickness $\alpha 1$ of the oxide film OM formed on the surface 62a by the continuous irradiation with the oxide film formation laser light L1 varies depending on the temperature T of the surface 62a that rises by the irradiation with the oxide film formation laser light L1 and the irradiation time H, or the duration of the irradiation. That is, the thickness al of the oxide film OM can be calculated by using the temperature T of the surface 62a and the irradiation time H.

The temperature measuring unit 142 measures the temperature T of the surface 62a at the time of the irradiation of the surface 62a with the oxide film formation laser light L1. The temperature T of the surface 62a is measured with a non-contact infrared thermometer 39. It should be noted that the present invention is not limited to this, and the temperature T of the surface 62a may be measured with any measuring instrument. The temperature measuring unit 142 transmits the data of the measured temperature T to the thickness calculating unit 144.

The irradiation time measuring unit 143 measures the irradiation time H of the continuous irradiation of the surface 62a with the oxide film formation laser light L1. The irradiation time H may be actually measured. However, the present invention is not limited to this, and the irradiation time measuring unit 143 may obtain data of preset irradiation time from the laser light control unit 141a. The irradiation time measuring unit 143 transmits the data of the irradiation time H to the thickness calculating unit 144.

The thickness calculating unit 144 calculates the thickness al of the oxide film OM formed by the continuous irradiation with the oxide film formation laser light L1 based on the temperature T and the irradiation time H obtained from the temperature measuring unit 142 and the irradiation time measuring unit 143.

The thickness determining unit 145 determines if the thickness al of the oxide film OM calculated by the thickness calculating unit 144 has reached the range of the predetermined thickness $\alpha$.

The predetermined thickness $\alpha$ is set to a value that allows the heating laser light L2 to be absorbed by the surface 62a of the lead frame 62 more efficiently than before. As shown in the graph of FIG. 6, the predetermined thickness $\alpha$ is set in the range of 35 nm to 360 nm.

In order to set the range of the thickness $\alpha$ in this manner, the inventors repeatedly conducted experiments to obtain the relationship between the thickness of the oxide film OM and the absorption of the laser light L by the metal member. The graph of FIG. 6 was obtained from the results of the experiments.

Figure 6:
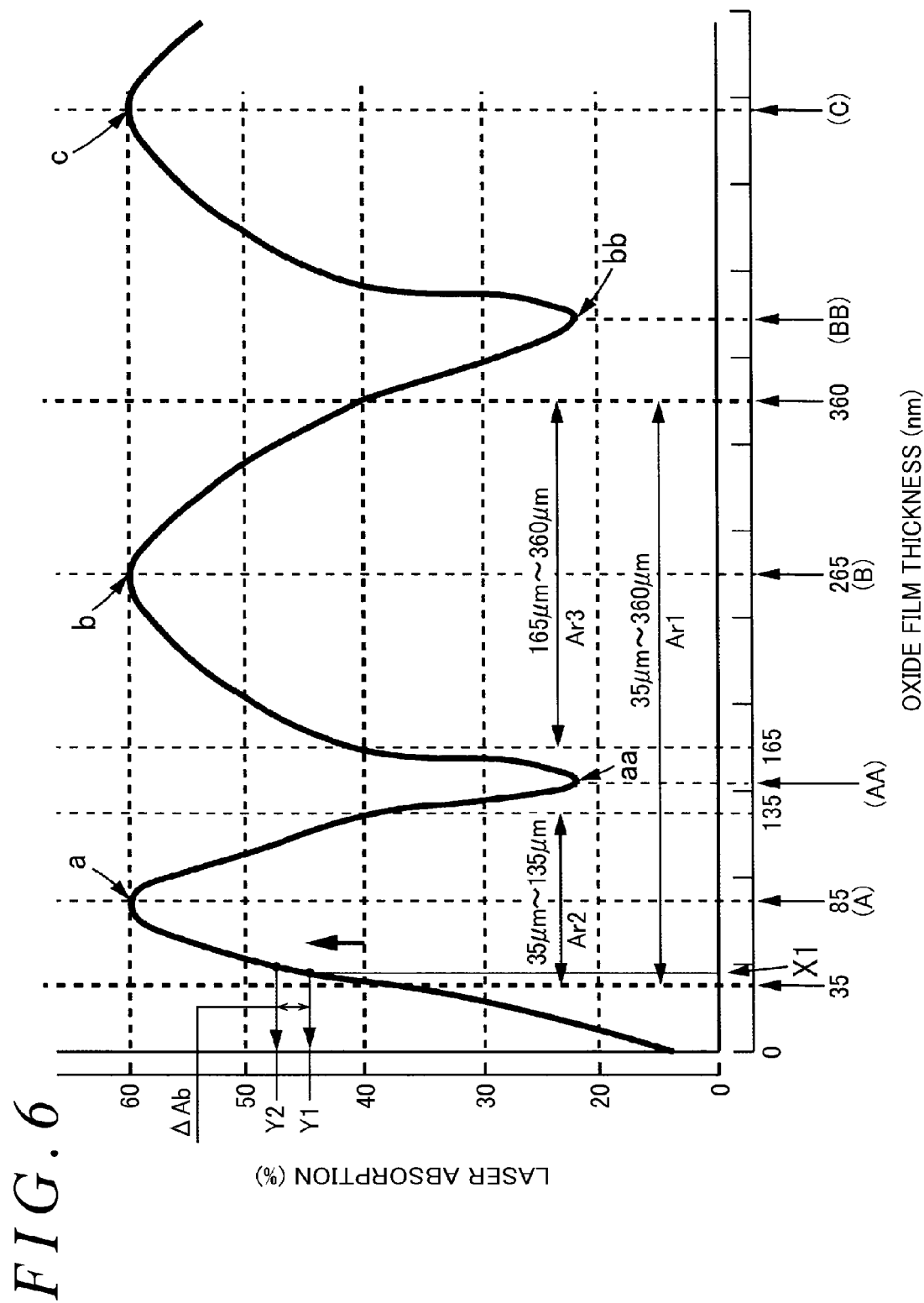
FIG. 6 is a graph showing the relationship between the thickness of the oxide film and the laser absorption.

In the graph of FIG. 6, the abscissa represents the thickness (nm) of the oxide film OM formed on the metal surface, and the ordinate represents the laser absorption (%) of the lead frame 62 at the time the surface 62a of the lead frame 62 (metal member) is irradiated with the laser light L through the oxide film OM formed on the surface 62a.

The graph of FIG. 6 shows that, in the relationship with the thickness of the oxide film OM, the laser absorption has a periodic profile with maximal values (about 60%) and minimal values (about 20%) appearing alternately as the thickness of the oxide film OM increases. When the thickness of the oxide film OM is zero, the laser absorption is less than 10%. However, in the entire region where the thickness is larger than zero, the laser absorption is higher than that corresponding to the thickness of zero.

The inventors set the predetermined thickness $\alpha$, which is larger than zero, in the range including a first maximal thickness A (85 nm) and a second maximal thickness B (265 nm) in the relationship with the laser absorption having the periodic profile. The first maximal thickness A corresponds to a first maximal value a of the laser absorption, namely the maximal value (60%) of the laser absorption that first appears as the thickness of the oxide film OM increases from zero. The second maximal thickness B corresponds to a second maximal value b of the laser absorption, namely the maximal value (60%) of the laser absorption that appears subsequent to the first maximal value a.

The inventors also set the predetermined thickness $\alpha$ in the range smaller than a second minimal thickness BB. The second minimal thickness BB corresponds to a second minimal value bb of the laser absorption, namely the minimal value of the laser absorption that appears between the second maximal value b and a third maximal value c, or the maximal value of the laser absorption that appears subsequent to the second maximal value b. A first range Ar1 is the range that includes the first maximal thickness A and the second maximal thickness B and that is smaller than the second minimal thickness BB (see FIG. 6).

Specifically, as shown in FIG. 6, the inventors set the predetermined thickness $\alpha$ of the first range Ar1 to the range of 35 nm to 360 nm, which is a practical range in terms of formation of the oxide film OM and control of the thickness thereof. As can be seen from the graph of FIG. 6, both 35 nm and 360 nm are the thicknesses corresponding to the laser absorption of about 40%.

In the above experiments, a metal member made of copper was used, a YAG laser was used to emit laser light L, and the laser light L was infrared laser light. The laser light L was laser light of the continuous wave CW, and the oxide film OM was formed in a heating furnace. The thickness of the oxide film OM was measured by sequential electrochemical reduction analysis (SERA). In the present embodiment, the thickness of the oxide film OM always refers to the thickness measured by SERA. SERA is a known method for measuring a film thickness. Specifically, the metal surface is first brought into contact with an electrolytic solution, and a very small current is applied from an electrode to cause a reduction reaction. Since each substance has a unique reduction potential, the thickness can be calculated by measuring the time required for reduction.

If the thickness determining unit 145 determines that the thickness a1 has reached the range of the predetermined thickness $\alpha$, the laser light control unit 141a controls the laser output adjusting unit 141b to change the output value of the laser light that is produced by the laser oscillator 121. That is, the laser light control unit 141a switches the output of the continuous wave CW from the high output level to the low output level. The laser light L is thus switched from the oxide film formation laser light L1 to the heating laser light L2. The surface 62a of the lead frame 62 is irradiated with the heating laser light L2 through the oxide film OM to heat the lead frame 62 to a predetermined surface temperature Ta.

Since the lead frame 62 has the oxide film OM formed on the surface 62a, the heating laser light L2 is more efficiently absorbed by the lead frame 62 than in the case where the lead frame 62 has no oxide film OM formed on the surface 62a. Whether the lead frame 62 has been heated to the predetermined surface temperature Ta or not can be determined by actually measuring the surface temperature of the lead frame 62 with the infrared thermometer 39.

However, the present invention is not limited to this, and the increased temperature of the surface 62a may be estimated from the laser absorption corresponding to the thickness (estimated thickness) of the oxide film OM formed on the surface 62a of the lead frame 62, which is obtained from the graph of FIG. 6, and the irradiation time with the heating laser light L2. If a surface temperature determining unit, not shown, determines that the surface temperature of the lead frame 62 has reached the predetermined surface temperature Ta, emission of the heating laser light L2 is stopped.

Figure 7:
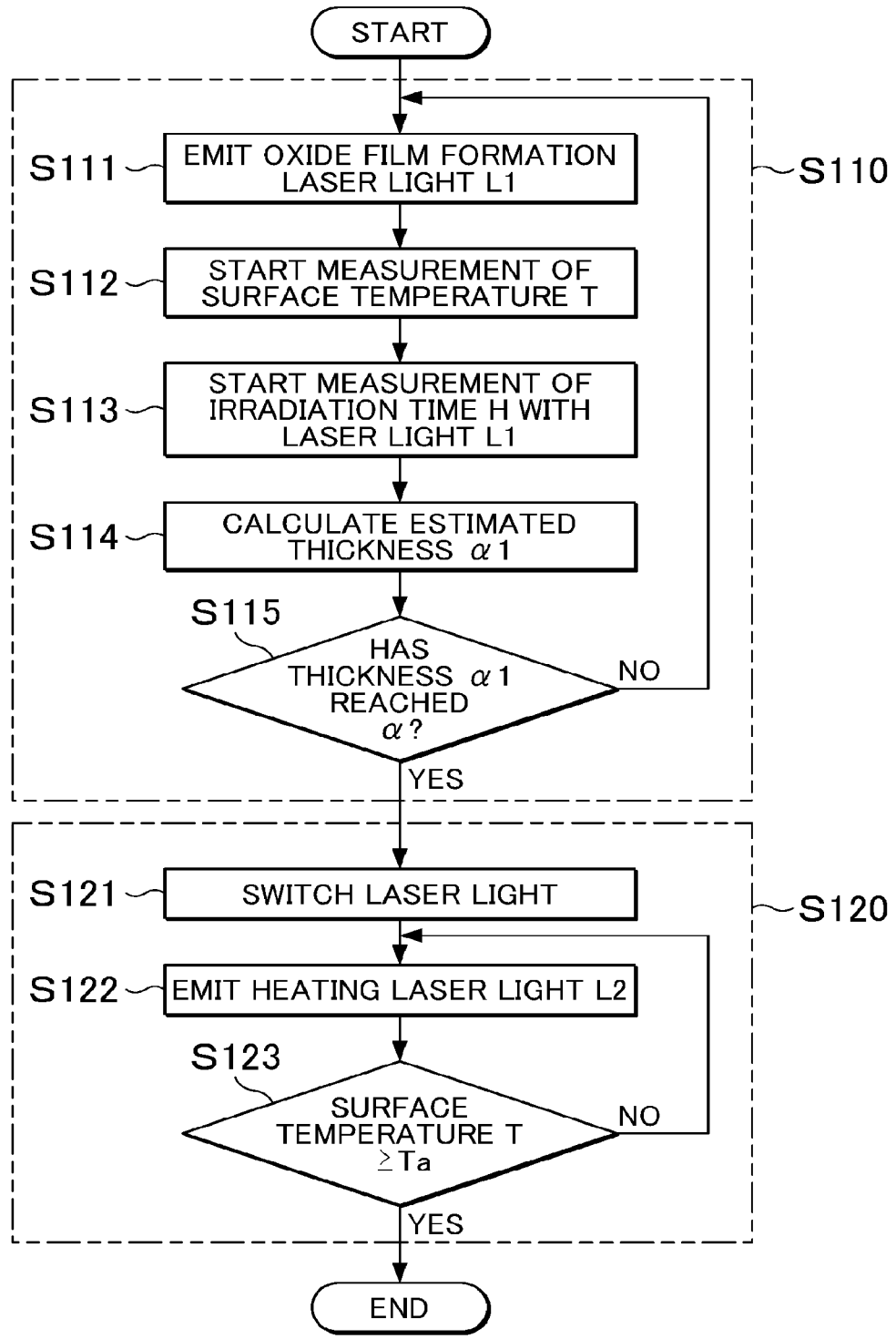
FIG. 7 is a first flowchart illustrating a heating method according to the first embodiment.

A method for heating the lead frame 62 (metal member) by the heating apparatus 100 will be described below with reference to the first flowchart of FIG. 7. The heating method includes an oxide film forming step S110 and a heating step S120. The oxide film forming step S110 includes an oxide film formation laser light emitting step S111, a temperature measuring step S112, an irradiation time measuring step S113, a thickness calculating step S114, and a thickness determining step S115. The heating step S120 includes a switching step S121, a heating laser light emitting step S122, and a surface temperature determining step S123.

In the oxide film formation laser light emitting step S111 (oxide film forming step S110), if the operator presses a start button, not shown, of the heating apparatus 100, the surface 62a of the lead frame 62 (metal member) is continuously irradiated with the oxide film formation laser light L1 (continuous wave CW1) under predetermined irradiation conditions (output, a radiation spot diameter, etc.) by the control of the laser light control unit 141a (laser output adjusting unit 141b) A target thickness a of the oxide film OM to be formed by irradiation with the oxide film formation laser light L1 may be input manually. Alternatively, a value pre-stored in a storage unit, not shown, of the control unit 140 may be obtained as the target thickness $\alpha$.

With this continuous irradiation, the temperature T of the surface 62a of the lead frame 62 increases, and the oxide film OM with a thickness (a1) according to the increased surface temperature T and the irradiation time H as shown in the graph of FIG. 3 is formed on the surface 62a of the lead frame 62.

In the temperature measuring step S112 (oxide film forming step S110), the temperature measuring unit 142 measures the temperature T of the surface 62a with the infrared thermometer 39 at regular time intervals during irradiation of the surface 62a with the oxide film formation laser light L1 and transmits measurement data to the thickness calculating unit 144 of the control unit 140.

In the irradiation time measuring step S113 (oxide film forming step S110), the irradiation time measuring unit 143 measures the continuous irradiation time of the surface 62a with the oxide film formation laser light L1 and transmits measurement data to the thickness calculating unit 144 of the control unit 140.

In the thickness calculating step S114 (oxide film forming unit S110), the thickness calculating unit 144 calculates an estimated thickness $\alpha$1 of the oxide film OM formed on the surface 62a based on the surface temperature T and the irradiation time H obtained in the temperature measuring step S112 and the irradiation time measuring step S113.

Next, in the thickness determining step S115 (oxide film forming step S110), the thickness determining unit 145 determines if the estimated thickness $\alpha$1 of the oxide film OM calculated by the thickness calculating unit 144 has reached the range of the predetermined thickness $\alpha$. If the thickness determining unit 145 determines that the estimated thickness $\alpha$1 has reached the range of the predetermined thickness $\alpha$, the routine proceeds to the switching step S121 (heating step S120). If the thickness determining unit 145 determines that the estimated thickness $\alpha$1 has not reached the range of the predetermined thickness $\alpha$, the routine returns to the oxide film formation laser light emitting step S111 (oxide film forming step S110). The steps S111 to S114 are repeated until the thickness determining unit 145 determines in the thickness determining step S115 that the estimated thickness a1 has reached the range of the predetermined thickness $\alpha$.

Subsequently, in the switching step S121 (heating step S120), the laser output adjusting unit 141b (laser light control unit 141a) causes the laser oscillator 121 to change the output of the laser light to switch the laser light from the oxide film formation laser light L1 to the heating laser light L2.

In the heating laser light emitting step S122 (heating step S120), the laser output adjusting unit 141b causes the heating laser light L2 to be emitted from the laser head 122 to the surface 62a of the lead frame 62 through the oxide film OM to heat the lead frame 62 to the predetermined surface temperature Ta. At this time, the hole 62c with a very small diameter has been formed in the surface 62a (irradiated position) of the lead frame 62, as described above.

Accordingly, when the surface 62a is irradiated with the heating laser light L2, a part of the heating laser light L2 enters the hole 62c, and the part of the heating laser light L2 that has entered the hole 62c is irregularly reflected by the side surface of the hole 62c, as described above. The heating laser light L2 is thus absorbed by the side surface of the hole 62c, whereby the temperature of the lead frame 62 is increased more quickly. In FIG. 5, transfer of the heat from the surface 62a of the lead frame 62 to the inside of the lead frame 62 is conceptually shown by a section different from that of the lead frame 62.

Subsequently, in the surface temperature determining step S123 (heating step S120), the surface temperature determining unit, not shown, determines if the temperature T of the surface 62a of the lead frame 62 has reached the predetermined surface temperature Ta (surface temperature T≥Ta). Whether the surface temperature T of the lead frame 62 has reached the predetermined surface temperature Ta or not may be determined by actually measuring the surface temperature of the lead frame 62 with the infrared thermometer 39. Alternatively, the increased temperature of the surface 62a of the lead frame 62 may be estimated by calculation using the laser absorption corresponding to the thickness of the oxide film OM formed on the surface 62a of the lead frame 62 and the irradiation time with the heating laser light L2.

If the surface temperature determining unit, not shown, determines that the temperature T of the surface 62a has reached the predetermined surface temperature Ta, the laser output adjusting unit 141b (laser light control unit 141a) stops emission of the heating laser light L2, and the program is terminated. If the surface temperature determining unit determines that the temperature T of the surface 62a has not reached the predetermined surface temperature Ta, the routine proceeds to the heating laser light emitting step S122, and the steps S122, S123 are performed until the temperature T of the surface 62a becomes equal to or larger than the surface temperature Ta (the surface temperature T the surface temperature Ta) in the surface temperature determining step S123.

The surface temperature Ta is a set value that varies depending on the purpose for heating the lead frame 62. For example, if the purpose for heating the lead frame 62 is to weld the first bonding surface 62b opposite to the surface 62a of the lead frame 62 to another member, the first bonding surface 62b needs to be heated to a temperature Tb required for welding. Accordingly, examinations are conducted beforehand and the temperature of the surface 62a of the lead frame 62 at the time the first bonding surface 62b has been heated to the temperature Tb required for welding is obtained in advance by experiments etc. The surface temperature Ta is set to this temperature of the surface 62a of the lead frame 62.

If the purpose for heating the lead frame 62 is to cut the lead frame 62, it is not necessary to set the surface temperature Ta. In this case, emission of the heating laser light L2 needs only to be continued until the lead frame 62 is cut. Although description of other examples is omitted, the surface temperature Ta can thus be set as desired according to the purpose for heating.

In the first embodiment, in the oxide film forming step S110, the thickness α1 of the oxide film OM formed on the surface 62a of the lead frame 62 is calculated based on the surface temperature T that is measured by the temperature measuring unit 142 and the irradiation time H from the start of irradiation with the oxide film formation laser light L1 that is measured by the irradiation time measuring unit 143. However, the present invention is not limited to this. In a first modification of the first embodiment, the estimated thickness α1 of the oxide film OM may be obtained by accumulating each thickness αA, αB, . . . of the oxide film OM additionally formed after the previous calculation, which is calculated based on the surface temperature t measured at regular time intervals and the irradiation time h. This modification has effects similar to those of the first embodiment.

Figure 8:
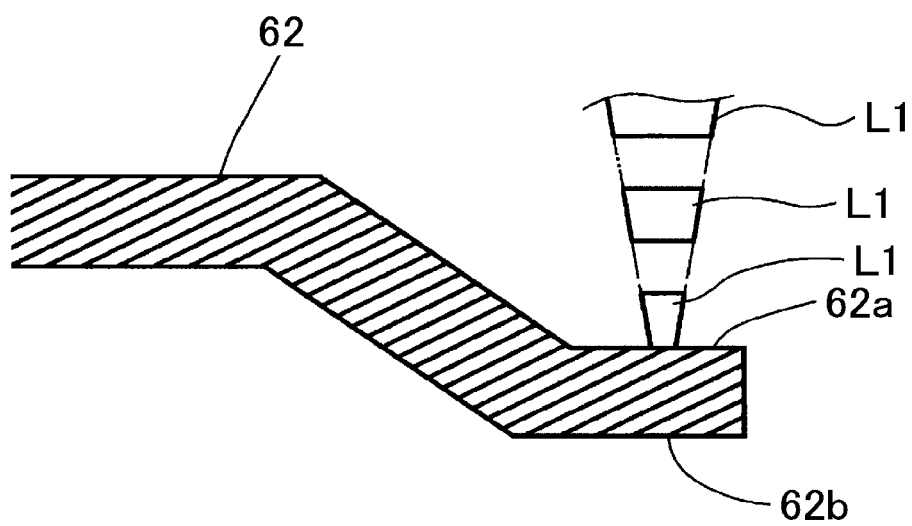
FIG. 8 is a conceptual diagram showing irradiation of a metal member with oxide film formation laser light, which is a pulse wave, in a heating apparatus according to a second embodiment.

A second embodiment will be described. In the first embodiment, both the oxide film formation laser light L1 and the heating laser light L2 are a continuous wave CW. However, the present invention is not limited to this. In the second embodiment, the oxide film formation laser light L1 in the first embodiment may be a pulse wave PW (see the conceptual diagram of FIG. 8). In this case, a heating apparatus 200 (see FIG. 9) of the second embodiment is different from the heating apparatus 100 of the first embodiment in the oxide film forming unit 120 and the control unit 140. The portions different from those of the first embodiment will be described in detail, and description of the portions similar to those of the first embodiment will be omitted. Configurations similar to those of the first embodiment are denoted with the same reference characters as those of the first embodiment.

Figure 9:
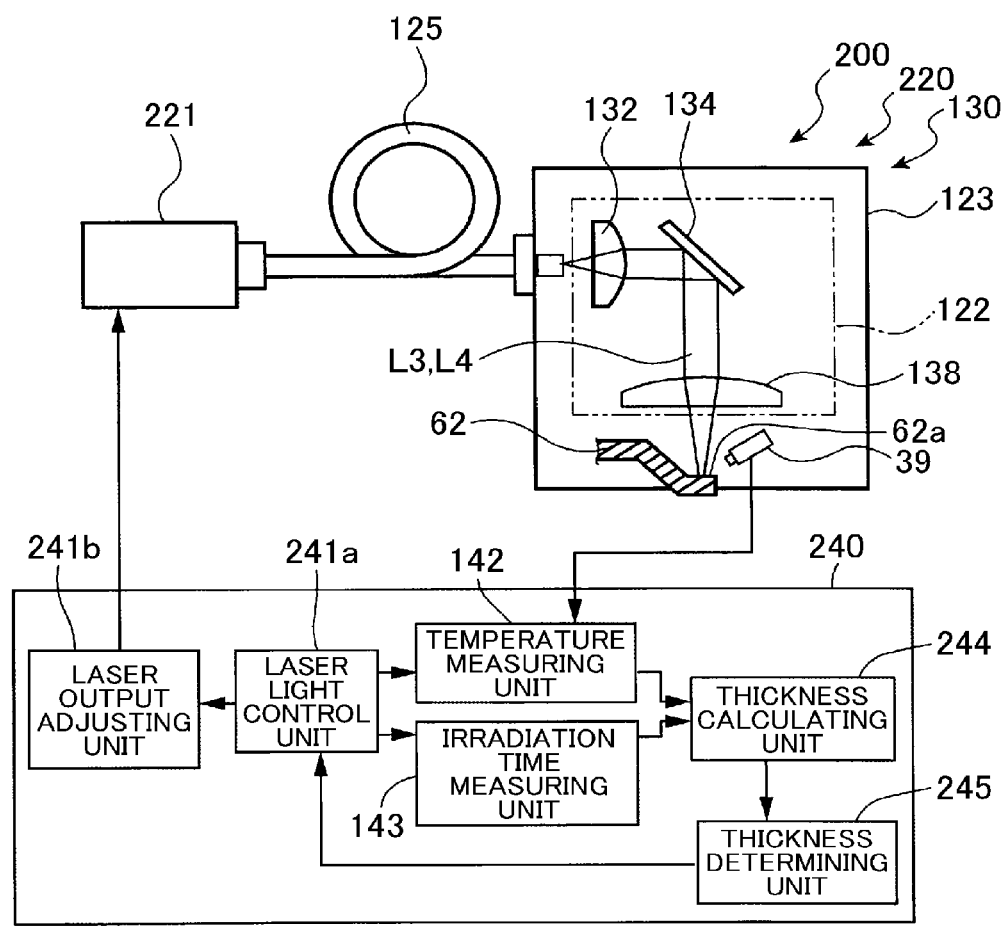
FIG. 9 is a schematic diagram of the heating apparatus according to the second embodiment.

FIG. 9 is a schematic diagram of the heating apparatus 200 according to the second embodiment. As shown in FIG. 9, the heating apparatus 200 includes an oxide film forming unit 220, a heating unit 130, and a control unit 240. The oxide film forming unit 220 forms an oxide film OM with a predetermined thickness α (accumulated thickness) on the surface of a lead frame 62 (metal member). The oxide film forming unit 220 includes a laser oscillator 221, a laser head 122, and a housing 123. The oxide film forming unit 220 further includes a laser light control unit 241a, a laser output adjusting unit 241b, a temperature measuring unit 142, an irradiation time measuring unit 143, a thickness calculating unit 244, and a thickness determining unit 245 that are included in the control unit 240 described below.

The laser oscillator 221 is a laser oscillator that can emit a pulse wave PW (see the conceptual diagram of FIG. 8) and a continuous wave CW (see the conceptual diagram of FIG. 2) by switching of laser light by the control unit 240. The pulse wave PW is laser light that is emitted intermittently. The pulse wave PW is emitted to the surface 62a (the upper surface in FIG. 9) of the lead frame 62 (metal member) under predetermined irradiation conditions (the timing at which the pulse wave is emitted, output, a radiation spot diameter, etc.) when the oxide film OM with the predetermined thickness α is formed on the surface 62a. Since the pulse wave PW tends to output a large amount of energy momentarily as compared to the continuous wave CW, the pulse wave PW is laser light suitable for formation of the oxide film OM that requires relatively high output.

In the present embodiment, the pulse wave PW and the continuous wave CW are the same kind of laser light that is emitted by the same device (the laser oscillator 221 and the laser head 122) to the surface 62a of the lead frame 62 and that has the same wavelength. The pulse wave PW is hereinafter referred to as the "oxide film formation laser light L3" and the continuous wave CW as the "heating laser light L4." The heating laser light L4 is the same as the heating laser light L2 of the first embodiment.

As in the first embodiment, it is preferable that the oxide film formation laser light L3 (pulse wave PW) be near-infrared laser light that is emitted by lasers such as a YAG laser. The laser head 122 (a collimating lens 132, a mirror 134, and an fθ lens 138) is similar to that of the first embodiment.

In the second embodiment, the surface 62a of the lead frame 62 is intermittently irradiated with the oxide film formation laser light L3 (pulse irradiation) with a predetermined number of pulses such that the oxide film formation laser light L3 is perpendicular to the surface 62a of the lead frame 62. With this intermittent irradiation with the oxide film formation laser light L3, the oxide film OM with, e.g., a diameter of about 200 μm and a predetermined thickness α larger than zero is formed on the surface 62a of the lead frame 62. At this time, as in the first embodiment, a hole 62c having a very small opening diameter is formed in the surface 62a (irradiated position) of the lead frame 62 irradiated with the oxide film formation laser light L3. The heating unit 130 is similar to the heating unit 130 of the first embodiment.

The control unit 240 is a control device that controls operation of the oxide film forming unit 220 and the heating unit 130. The control unit 240 includes the laser light control unit 241*a*, the laser output adjusting unit 241*b*, the temperature measuring unit 142, the irradiation time measuring unit 143, the thickness calculating unit 244, and the thickness determining unit 245. As described above, the laser light control unit 241*a*, the laser output adjusting unit 241*b*, the temperature measuring unit 142, the irradiation time measuring unit 143, the thickness calculating unit 244, and the thickness determining unit 245 are included in the oxide film forming unit 220.

The control unit 240 includes the laser light control unit 241*a*, the laser output adjusting unit 241*b*, and the temperature measuring unit 142 that control operation of the heating unit 130. The laser light control unit 241*a*, the laser output adjusting unit 241*b*, and the temperature measuring unit 142 are provided for both the oxide film forming unit 220 and the heating unit 130 and are also included in the heating unit 130.

Figure 10:
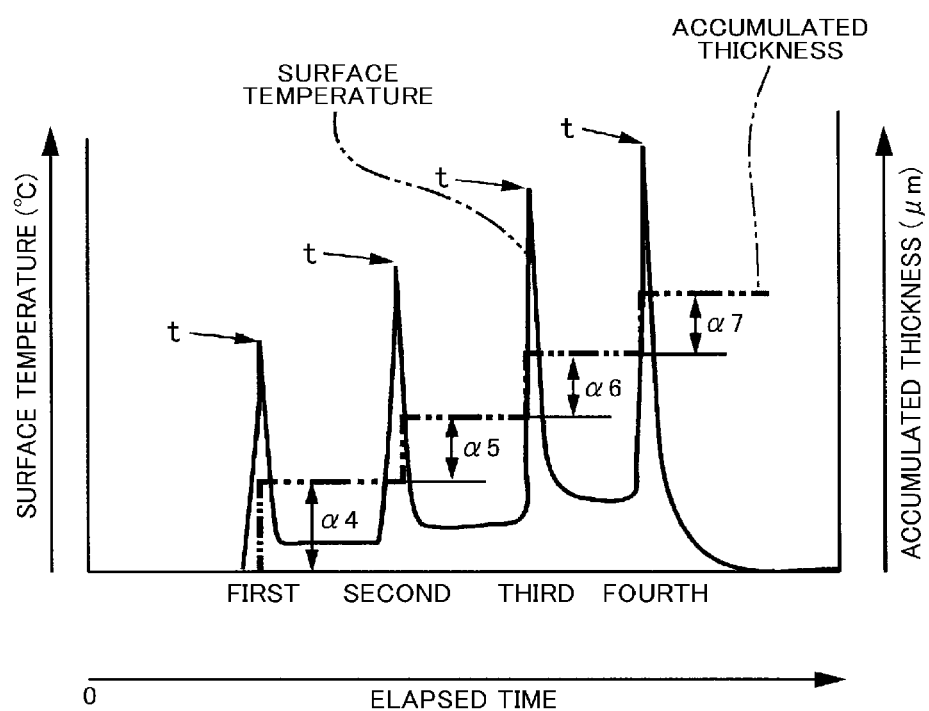
FIG. 10 is a graph showing a process in which an oxide film is formed on the surface of the metal member by irradiation with oxide film formation laser light in the heating apparatus according to the second embodiment.

In response to a command from the laser light control unit 241*a*, the laser output adjusting unit 241*b* produces the oxide film formation laser light L3 (pulse wave PW) and intermittently irradiates the surface 62*a* of the lead frame 62 (metal member) with the oxide film formation laser light L3 under predetermined irradiation conditions. As shown in FIG. 10, the temperature of the surface 62*a* of the lead frame 62 is increased momentarily by the first irradiation in the intermittent irradiation with the oxide film formation laser light L3. The oxide film OM is thus formed at the irradiated position, and the surface 62*a* of the lead frame 62 is rapidly cooled in air at once. In the graph of FIG. 10, the abscissa represents elapsed time and the ordinates represent the temperature of the surface 62*a* of the lead frame 62 and the thickness of the oxide film OM.

Upon each intermittent irradiation with the oxide film formation laser light L3, the oxide film OM is formed on the surface 62*a* of the lead frame 62 and is stacked (accumulated) on the oxide film OM that has been formed (see $\alpha 4$ to $\alpha 7$ in FIG. 10). Each thickness $\alpha 4$ to $\alpha 7$ of the oxide film OM that is formed by each intermittent irradiation with the oxide film formation laser light L3 is the thickness according to the temperature t of the surface 62*a* that is increased by the irradiation with the oxide film formation laser light L3 and the irradiation time h (duration of the irradiation). That is, each thickness of the oxide film OM can be calculated by the temperature t of the surface 62*a* and the irradiation time h (not shown). The temperature measuring unit 142 is similar to that of the first embodiment.

The irradiation time measuring unit 143 measures the irradiation time h of each intermittent irradiation of the surface 62*a* with the oxide film formation laser light L3. In this case, the irradiation time h may be actually measured. However, the present invention is not limited to this, and the irradiation time measuring unit 143 may obtain data of preset irradiation time with the oxide film formation laser light L3 from the control unit 240. The irradiation time measuring unit 143 then transmits the data of the irradiation time to the thickness calculating unit 244 of the control unit 240.

The thickness calculating unit 244 calculates each thickness $\alpha 4, \alpha 5, \ldots, \alpha n$ of the oxide film OM formed by each intermittent irradiation with the oxide film formation laser light L3 or a pulse wave, based on the surface temperature t and the irradiation time h that are obtained by the temperature measuring unit 142 and the irradiation time measuring unit 143. The thickness calculating unit 244 sequentially accumulates the calculated thicknesses $\alpha 4, \alpha 5, \ldots, \alpha n$ to calculate the accumulated thickness $\Sigma (\alpha 4 + \alpha 5 + \ldots + \alpha n)$ of the oxide film OM.

The thickness determining unit 245 determines if the accumulated thickness $\Sigma (\alpha 4 + \alpha 5 + \ldots + \alpha n)$ of the oxide film OM, which is an estimated thickness calculated by the thickness calculating unit 244, has reached the range of the predetermined thickness $\alpha$.

If the thickness determining unit 245 determines that the accumulated thickness $\Sigma (\alpha 4 + \alpha 5 + \ldots + \alpha n)$ has reached the range of the predetermined thickness $\alpha$, the laser output adjusting unit 141*b* makes an adjustment to reduce the output of the oxide film formation laser light L3 and to perform continuous irradiation to switch the laser light from the oxide film formation laser light L3 to the heating laser light H4, in response to a command of the laser light control unit 141*a*. The laser output adjusting unit 141*b* irradiates the surface 62*a* of the lead frame 62 with the heating laser light L4 through the oxide film OM to heat the lead frame 62 to the predetermined surface temperature Ta. The second embodiment thus has effects similar to those of the first embodiment.

A method for heating the lead frame 62 (metal member) by the heating apparatus 200 will be described below with reference to the second flowchart of FIG. 11. The heating method includes an oxide film forming step S210 and a heating step S120 The oxide film forming step S210 includes an oxide film formation laser light emitting step S211, a temperature measuring step S212, an irradiation time measuring step S213, an accumulated thickness calculating step S214, and a thickness determining step S215. The heating step S120 includes a switching step S121, a heating laser light emitting step S122, and a surface temperature determining step S123. Since the heating step S120 is the same as the heating step S120 of the first embodiment, description thereof will be omitted.

In the oxide film formation laser light emitting step S211 of the oxide film forming step S210, if the operator presses a start button, not shown, of the heating apparatus 200, the surface 62*a* of the lead frame 62 (metal member) is intermittently irradiated with the oxide film formation laser light L3 (pulse wave PW) under predetermined irradiation conditions (output, a radiation spot diameter, etc.) by the control of the laser light control unit 241*a* and the laser output adjusting unit 241*b*.

The temperature t of the surface 62*a* of the lead frame 62 is rapidly increased by each intermittent irradiation as shown in the graph of FIG. 10, and the oxide film OM with a thickness ($\alpha 4$ to $\alpha 7$) according to the increased surface temperature t and the irradiation time h of each intermittent irradiation is formed on the surface 62*a*. After each increase in surface temperature, the surface temperature t decreases rapidly.

However, the temperature t of the surface 62*a* of the lead frame 62 does not completely decrease to normal temperature, or an initial temperature, after each intermittent irradiation with the oxide film formation laser light L3. Accordingly, in each of the second and subsequent intermittent irradiations with the oxide film formation laser light L3, the surface 62*a* of the lead frame 62 has a slightly higher temperature at the start of the irradiation than the initial temperature (in the case of the second intermittent irradiation) or the temperature at the start of the previous irradiation.

As shown in FIG. 10, the highest surface temperature t that can be reached by irradiation with the oxide film formation laser light L3 therefore increases little by little even if the oxide film formation laser light L3 is emitted with the same output each time. In each intermittent irradiation with the oxide film formation laser light L3, the oxide film OM with the thickness α4, α5, . . . , αn is formed on the surface 62a of the lead frame 62 and the thickness α4, α5, . . . , αn is accumulated (see FIG. 10). The graph of FIG. 10 shows only α4 to α7 for convenience.

The temperature measuring step S212 is similar to the temperature measuring step S112 of the first embodiment. In the irradiation time measuring step S213, the irradiation time measuring unit 143 measures each irradiation time h of the intermittent irradiation of the surface 62a with the oxide film formation laser light L3 and transmits the measurement data to the thickness calculating unit 244 of the control unit 240.

In the accumulated thickness calculating step S214, the thickness calculating unit 244 calculates the thickness α4, α5, . . . , αn of the oxide film OM formed on the surface 62a by each intermittent irradiation with the oxide film formation laser light L3, based on the surface temperature t and the irradiation time h obtained in the temperature measuring step S212 and the irradiation time measuring step S213. The thickness calculating unit 244 accumulates the thickness α4, α5, . . . , αn to calculate the accumulated thickness Σ (α4+α5+ . . . +αn), or the estimated thickness, of the oxide film OM.

Subsequently, in the thickness determining step S215, the thickness determining unit 245 determines if the accumulated thickness Σ (estimated thickness) of the oxide film OM calculated by the thickness calculating unit 244 has reached the predetermined thickness α. If the thickness determining unit 245 determines that the accumulated thickness Σ has reached the predetermined thickness α, the routine proceeds to the switching step S121 of the heating step S120.

If the thickness determining unit 245 determines that the accumulated thickness Σ has not reached the predetermined thickness α, the routine returns to the oxide film formation laser light emitting step S211. The steps S211 to S214 are repeated until the thickness determining unit 245 determines in the thickness determining step S215 that the accumulated thickness Σ has reached the predetermined thickness α. The predetermined thickness α is set as described above. The heating step S120 is similar to that of the first embodiment. Heating having effects similar to those of the first embodiment can therefore be performed.

In the second embodiment, the oxide film formation laser light L3 is a pulse wave PW, and the heating laser light L4 is a continuous wave CW. However, the present invention is not limited to this. In a first modification of the second embodiment, the oxide film formation laser light L3 may be a continuous wave CW, and the heating laser light L4 may be a pulse wave PW. In a second modification of the second embodiment, both the oxide film formation laser light L3 and the heating laser light L4 may be a pulse wave PW. These modifications have appropriate effects.

Figure 12:
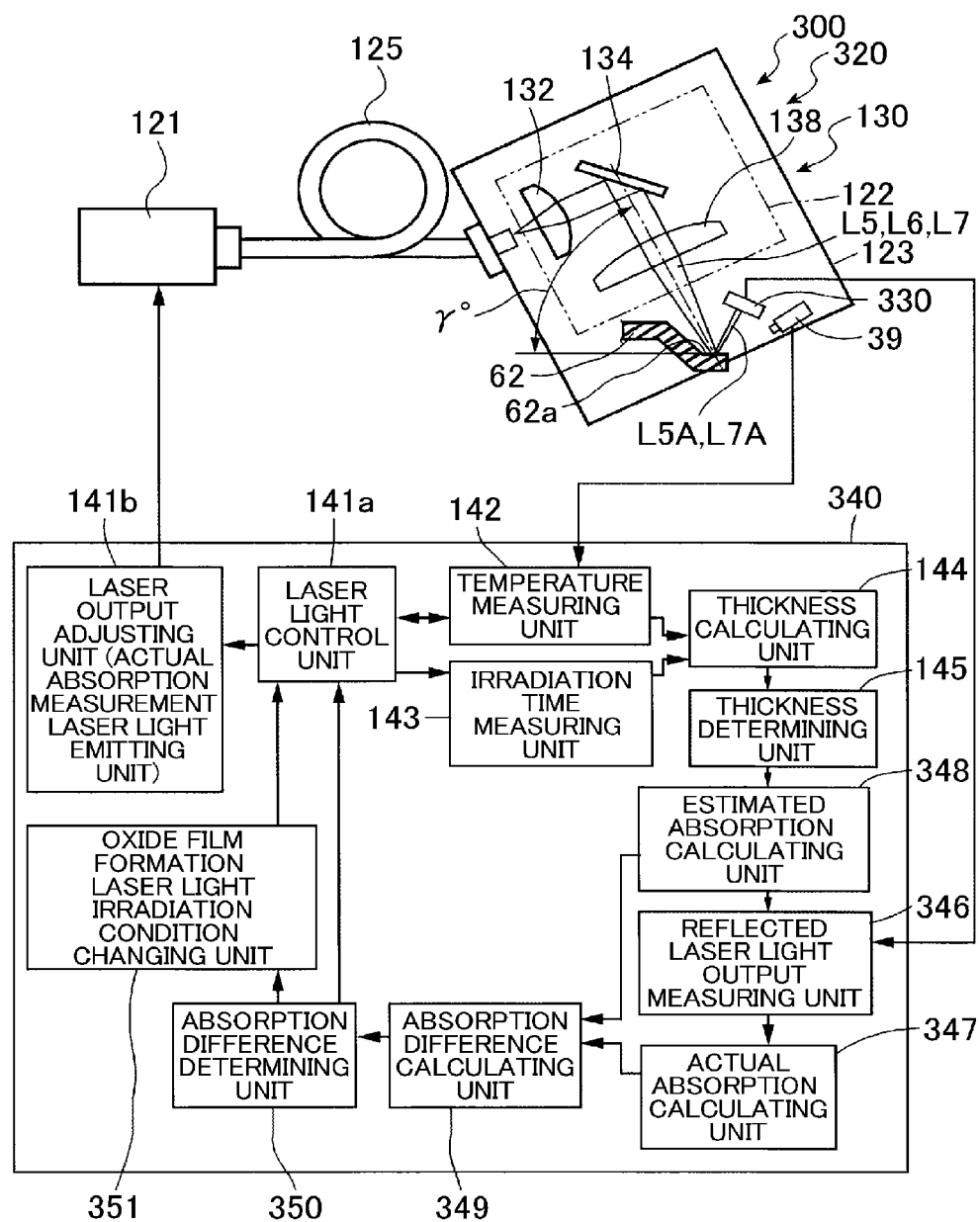
FIG. 12 is a schematic diagram of a heating apparatus according to a third embodiment.

A heating apparatus 300 of a third embodiment will be described. As shown in FIG. 12, the heating apparatus 300 of the third embodiment is different from the heating apparatus 100 of the first embodiment in the oxide film forming unit 120 and the control unit 140. The heating apparatus 300 of the third embodiment includes an oxide film forming unit 320, a heating unit 130, and a control unit 340. In the third embodiment, both oxide film formation laser light L5 and heating laser light L6 are a continuous wave CW as in the first embodiment. In the description of the heating apparatus 300, configurations similar to those of the heating apparatus 100 of the first embodiment are denoted with the same reference characters as those of the first embodiment.

The heating apparatus 300 according to the third embodiment will be generally described below. The heating apparatus 300 irradiates a surface 62a of a lead frame 62 with absorption measurement laser light when forming an oxide film OM by the oxide film forming unit 320, and calculates actual absorption Abr based on the output of reflected light of the absorption measurement laser light from the surface 62a. The actual absorption Abr is actual absorption of the heating laser light L6 by the lead frame 62. The heating apparatus 300 obtains the difference ΔAb between the calculated actual absorption Abr and estimated absorption Abe obtained based on an estimated thickness calculated by a thickness calculating unit 144. Based on the difference ΔAb, the heating apparatus 300 sets irradiation conditions with the oxide film formation laser light L5. The calculated estimated thickness is required to have reached the range of a predetermined thickness α.

It is preferable that the measurement laser light that is used to calculate the actual absorption Abr (actual absorption measurement laser light L7) be the same kind of laser light as the heating laser light L6 or the oxide film formation laser light L5. This allows the actual absorption Abr to be obtained with higher accuracy. Accordingly, in the present embodiment, the oxide film formation laser light L5 is also used as the actual absorption measurement laser light L7.

However, the present invention is not limited to this. Laser light that is emitted under the same irradiation conditions as those of the heating laser light L6 may be used as the actual absorption measurement laser light L7, and the absorption in the case where the heating laser light L6 is emitted may be estimated from measurement data of reflected light obtained. Alternatively, laser light that is emitted under different irradiation conditions from those of the oxide film formation laser light L5 and the heating laser light L6 may be used as the actual absorption measurement laser light L7, and the absorption in the case where the heating laser light L6 is emitted may be estimated from measurement data of reflected light obtained.

The oxide film forming unit 320 of the heating apparatus 300 includes a laser oscillator 121, a laser head 122, a housing 123, and a power meter 330 described below. The oxide film forming unit 320 includes a laser light control unit 141a, a laser output adjusting unit 141b (also used as an actual absorption measurement laser light emitting unit), a temperature measuring unit 142, an irradiation time measuring unit 143, the thickness calculating unit 144, a thickness determining unit 145, a reflected laser light output measuring unit 346, an actual absorption calculating unit 347, an estimated absorption calculating unit 348, an absorption difference calculating unit 349, an absorption difference determining unit 350, and an oxide film formation laser light irradiation condition changing unit 351 that are included in the control unit 340.

As shown in FIG. 12, the laser head 122 is placed at a predetermined angle γ° with respect to the surface 62a of the lead frame 62. The power meter 330 is placed at a desired position and a desired angle that allow the reflected laser light L7A (L5A), or the actual absorption measurement laser light L7 (oxide film formation laser light L5) emitted from the laser head 122 toward the surface 62a and reflected from the surface 62a, to be entirely incident on the incident surface of the power meter 330. The power meter 330 is connected to the reflected laser light output measuring unit 346 and transmits measurement data to the reflected laser light output measuring unit 346.

The control unit 340 is a control device that controls operation of the oxide film forming unit 320 and the heating unit 130. The control unit 340 includes the laser light control unit 141a, the laser output adjusting unit 141b (also used as the actual absorption measurement laser light emitting unit), the temperature measuring unit 142, the irradiation time measuring unit 143, the thickness calculating unit 144, the thickness determining unit 145, the reflected laser light output measuring unit 346, the actual absorption calculating unit 347, the estimated absorption calculating unit 348, the absorption difference calculating unit 349, the absorption difference determining unit 350, and the oxide film formation laser light irradiation condition changing unit 351 that control operation of the oxide film forming unit 320.

The control unit 340 includes the laser light control unit 141a and the laser output adjusting unit 141b that control operation of the heating unit 130. The laser light control unit 141a and the laser output adjusting unit 141b are provided for both the oxide film forming unit 320 and the heating unit 130 and are also included in the heating unit 130.

Since the laser light control unit 141a, the laser output adjusting unit 141b (also used as the actual absorption measurement laser light emitting unit), the temperature measuring unit 142, the irradiation time measuring unit 143, the thickness calculating unit 144, and the thickness determining unit 145 that are included in the control unit 340 are the same as those of the control unit 140 of the first embodiment, description thereof will be omitted.

Figure 13:
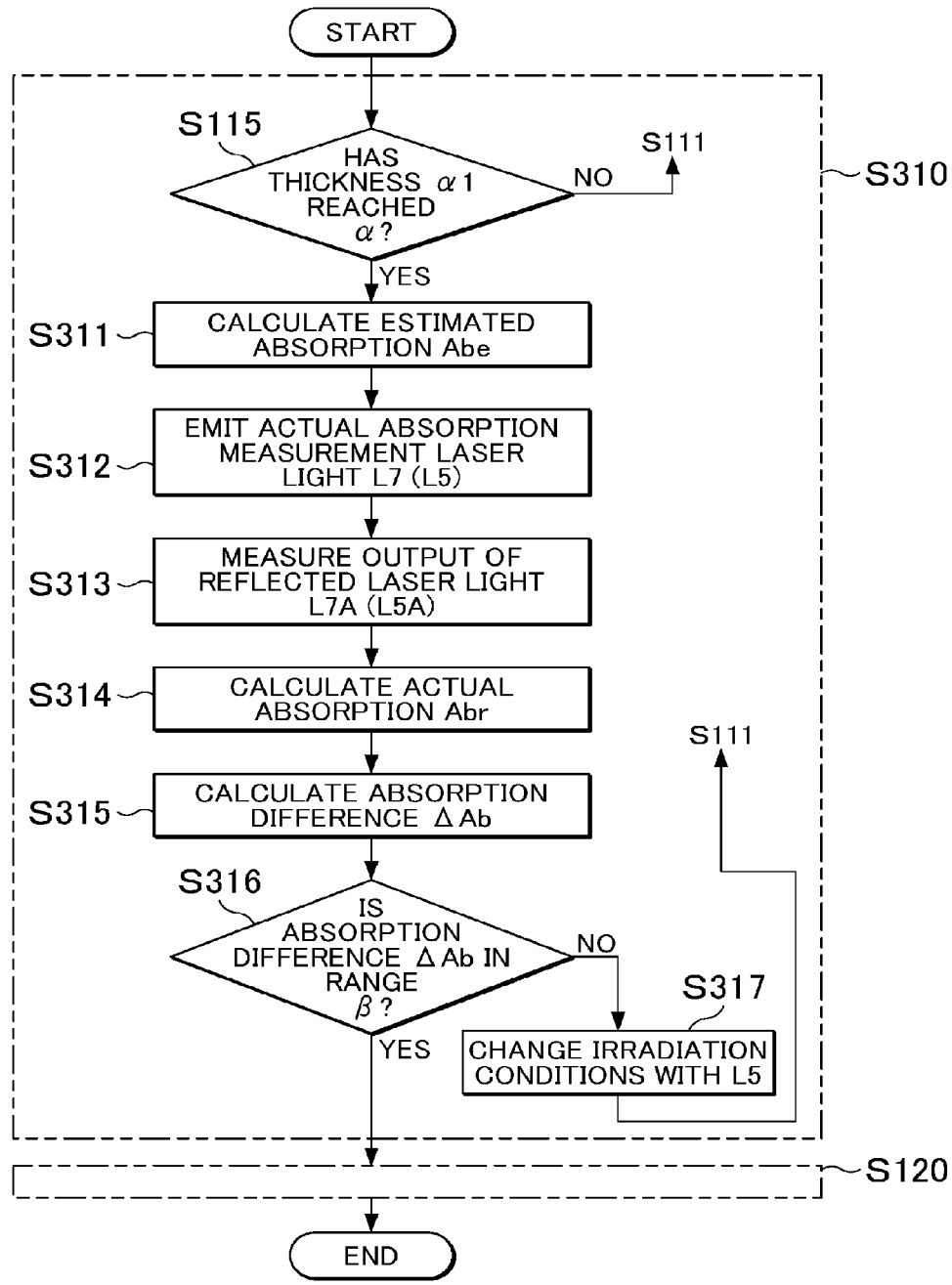
FIG. 13 is a third flowchart illustrating a heating method according to the third embodiment.

A method for heating the lead frame 62 (metal member) by the heating apparatus 300 will be described with reference to the third flowchart of FIG. 13. The heating method of the heating apparatus 300 includes an oxide film forming step S310 and a heating step S120 similar to that of the first embodiment. The oxide film forming step S310 includes an oxide film formation laser light emitting step S111, a temperature measuring step S112, an irradiation time measuring step S113, a thickness calculating step S114, a thickness determining step S115, an estimated absorption calculating step S311, an actual absorption measurement laser light emitting step S312, a reflected laser light output measuring step S313, an actual absorption calculating step S314, an absorption difference calculating step S315, an absorption difference determining step S316, and an oxide film formation laser light irradiation condition changing step S317.

The oxide film forming step S310 of the third flowchart is similar to the oxide film forming step S110 of the first embodiment up to the thickness determining step S115, but is different from the oxide film forming step S110 of the first embodiment in the steps subsequent to the thickness determining step S115. Accordingly, only the thickness determining step S115 and the subsequent steps will be described in the present embodiment. Since the heating step S120 is also similar to that of the first flowchart, description thereof will be omitted.

In the third embodiment, an estimated thickness αl of the oxide film OM is calculated in the thickness calculating step S114. In the thickness determining step S115, it is determined if the calculated estimated thickness α1 of the oxide film OM has reached the range of a predetermined thickness α. If it is determined that the estimated thickness αl has reached the range of the predetermined thickness α, the routine proceeds to the estimated absorption calculating step S311.

If it is determined in the thickness determining step S115 that the estimated thickness αl has not reached the range of the predetermined thickness α, the routine returns to the oxide film formation laser light emitting step S111. The steps S111 to S114 are repeated until it is determined in the thickness determining step S115 that the estimated thickness α1 has reached the range of the predetermined thickness α.

Subsequently, estimated absorption Abe is calculated in the estimated absorption calculating step S311. In the estimated absorption calculating step S311, the estimated absorption calculating unit 348 calculates the estimated absorption Abe based on the relationship between the thickness of the oxide film OM and the absorption Ab having the periodic profile shown in FIG. 6. That is, based on the graph of FIG. 6, the estimated absorption calculating unit 348 calculates the estimated absorption Abe of the heating laser light L6 that corresponds to the estimated thickness αl calculated by the thickness calculating unit 144 and determined to have reached the predetermined thickness α in the thickness determining step S115. For example, in the case where the estimated thickness calculated by the thickness calculating unit 144 is X1, the estimated absorption Abe is Y1 in FIG. 6.

Subsequently, in the actual absorption measurement laser light emitting step S312 (oxide film forming step S310), the actual absorption measurement laser light emitting unit (also used as the laser output adjusting portion 141b) irradiates the surface 62a of the lead frame 62 (metal member) with the actual absorption measurement laser light L7 (also used as the oxide film formation laser light L5) through the oxide film OM whose estimated thickness αl has been determined to have reached the range of the predetermined thickness α in the thickness determining step S115.

At this time, emission of the oxide film formation laser light L5 is stopped, and is then resumed for measurement of the actual absorption. However, the present invention is not limited to this. Emission of the oxide film formation laser light L5 may be continued without being stopped. It is preferable that the irradiation conditions be such that the irradiation time with the oxide film formation laser light L5 be short so that no additional oxide film OM is formed.

In the present embodiment, the oxide film formation laser light L5 instead of the heating laser light L6 is used as the actual absorption measurement laser light L7. Accordingly, the actual absorption Abr calculated in this case may be slightly different from that calculated in the case where the surface 62a of the lead frame 62 is irradiated with the heating laser light L6 through the oxide film OM. However, the inventors considered that this difference was very small, and calculated the actual absorption Abr by using the oxide film formation laser light L5.

The actual absorption measurement laser light L7 (oxide film formation laser light L5) emitted to the oxide film OM on the surface 62a of the lead frame 62 (metal member) is partially reflected as the reflected laser light L7A. The actual absorption measurement laser light L7 other than the reflected laser light L7A (L5A) is absorbed by the lead frame 62.

In the reflected laser light output measuring step S313, the reflected laser light output measuring unit 346 measures the output of the reflected laser light L7A (L5A) with the power meter 330 connected to the reflected laser light output measuring unit 346. The power meter 330 transmits the measurement data to the actual absorption calculating unit 347. Since the power meter 330 is a known measuring instrument that measures the output of laser light, detailed description thereof will be omitted. The output of the reflected laser light L7A (L5A) need not necessarily be measured with the power meter, and may be measured with a beam profiler, a charge-coupled device (CCD) sensor, a complementary metal-oxide-semiconductor (CMOS) sensor, etc.

In the actual absorption calculating step S314, the actual absorption calculating unit 347 calculates the actual absorption Abr of the heating laser light L6 based on the reflected laser light L7A (L5A). The actual absorption Abr is calculated by the equation: Abr=((P1−P2)/P1). P1 represents the initial output of the actual absorption measurement laser light L7 (oxide film formation laser light L5) that is emitted to the surface 62a, and P2 represents the output of the measured reflected laser light L7A (L5A). As shown in FIG. 6, the actual absorption Abr is Y2.

Subsequently, in the absorption difference calculating step S315, the absorption difference calculating unit 349 calculates the difference ΔAb (=Abr−Abe=Y2−Y1) between the estimated absorption Abe calculated in the estimated absorption calculating step S311 and the actual absorption Abr calculated in the actual absorption calculating step S314 and corresponding to the oxide film OM that had been formed at the time the estimated absorption Abe was calculated. The absorption difference calculating unit 349 transmits the calculation result to the absorption difference determining unit 350.

In the absorption difference determining step S316, the absorption difference determining unit 350 determines if the calculated absorption difference ΔAb (=Y2−Y1) is in a predetermined range β. If the absorption difference ΔAb is in the predetermined range β, the absorption difference determining unit 350 determines that the calculation result of the estimated thickness is reliable, and the routine proceeds to the switching step S121 of the heating step S120. The predetermined range β is set as desired based on experiments conducted beforehand etc.

In the heating step S120, the laser output adjusting unit 141b irradiates the surface 62a of the lead frame 62 with the heating laser light L6 through the oxide film OM as in the first embodiment. The laser output adjusting unit 141b thus heats the lead frame 62 to a predetermined surface temperature ta. Subsequently, if a surface temperature determining unit, not shown, determines that the surface temperature of the lead frame 62 has reached the predetermined surface temperature ta, emission of the heating laser light L6 is stopped.

If the absorption difference determining unit 350 determines in the absorption difference determining step S316 that the absorption difference ΔAb is not in the predetermined range β, the routine proceeds to the oxide film formation laser light irradiation condition changing step S317. For example, in the oxide film formation laser light irradiation condition changing step S317, the oxide film formation laser light irradiation condition changing unit 351 changes the irradiation conditions with the oxide film formation laser light L5 so that the absorption difference ΔAb falls within the range β as quickly as possible.

The oxide film formation laser light irradiation condition changing unit 351 changes predetermined irradiation conditions with the oxide film formation laser light L5 based on the estimated thickness X1, the actual absorption Abr, and the relationship between the thickness of the oxide film OM and the absorption Ab having the periodic profile.

In other words, the oxide film formation laser light irradiation condition changing unit 351 changes the predetermined irradiation conditions with the oxide film formation laser light L5 based on the estimated absorption Abe calculated by the estimated absorption calculating unit 348 based on the estimated thickness X1, and the actual absorption Abr calculated by the actual absorption calculating unit 347 and corresponding to the oxide film OM that had been formed at the time the estimated absorption Abe was calculated. The estimated absorption Abe is obtained from the estimated thickness X1 and the relationship between the thickness of the oxide film OM and the absorption Ab having the periodic profile.

Specifically, if the absorption difference determining unit 350 determines that the absorption difference ΔAb is not in the predetermined range β, the oxide film formation laser light irradiation condition changing unit 351 changes the predetermined irradiation conditions with the oxide film formation laser light L5 according to the magnitude of the absorption difference ΔAb so that the absorption difference ΔAb falls within the predetermined range β in the subsequent determination of the absorption difference determining unit 350.

For example, in the case where the actual absorption Abr is lower than the estimated absorption Abe and the absorption difference ΔAb increases in the negative direction, the oxide film formation laser light irradiation condition changing unit 351 changes the irradiation conditions with the oxide film formation laser light L5 so that the oxide film OM is more likely to be formed. On the other hand, in the case where the actual absorption Abr is higher than the estimated absorption Abe and the absorption difference ΔAb increases in the positive direction, the oxide film formation laser light irradiation condition changing unit 351 changes the irradiation conditions with the oxide film formation laser light L5 so that the oxide film OM is less likely to be formed. This increases the possibility that the absorption difference ΔAb falls within the predetermined range β in the subsequent determination of the absorption difference determining unit 350. A desired thickness α of the oxide film OM is therefore quickly obtained. It is thus efficient to change the irradiation conditions in the manner described above.

In the third embodiment, the surface 62a of the lead frame 62 is irradiated with the actual absorption measurement laser light L7 (oxide film formation laser light L5) through the oxide film OM. Subsequently, the power meter 330 directly receives the reflected laser light L7A (L5A) from the surface 62a of the lead frame 62. However, the present invention is not limited to this.

Figure 14:
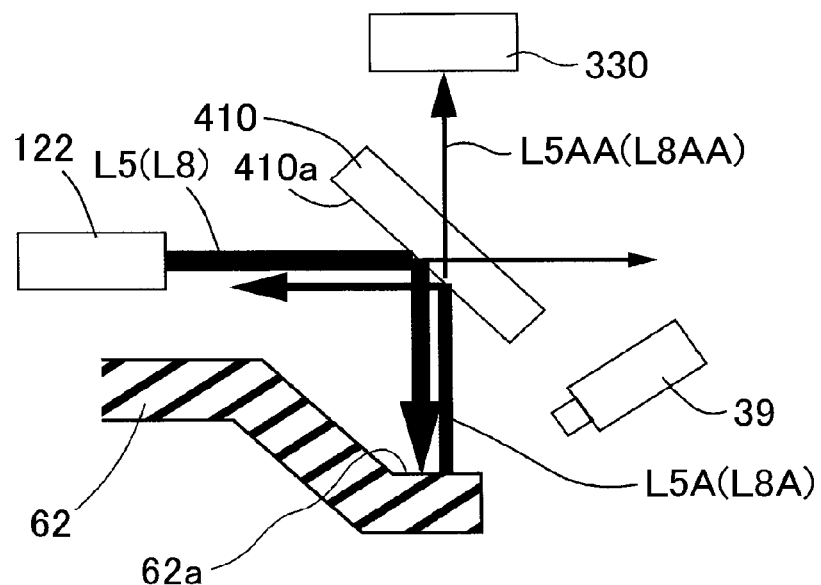
FIG. 14 is a diagram illustrating the configuration of a first modification of the third embodiment.

As shown in FIG. 14, in a first modification of the third embodiment, the heating apparatus 300 may include a dichroic mirror 410 on the optical axis of the oxide film formation laser light L5 (actual absorption measurement laser light L8). The dichroic mirror 410 is an element that reflects light of a specific wavelength range (e.g., near-infrared wavelengths) and transmits light of other wavelength ranges. The present invention is not limited to the dichroic mirror, and any element having such characteristics may be used.

As shown in FIG. 14, the dichroic mirror 410 is placed between the laser head 122 and the surface 62a of the lead frame 62, namely on the optical axis of the oxide film formation laser light L5 (L8), so as to be tilted at about 45 degrees with respect to the surface 62a. In the first modification in which the dichroic mirror 410 is placed in this manner, the oxide film formation laser light L5 (L8) is emitted from the laser head 122 toward the dichroic mirror 410. The laser head 122 is placed such that the optical axis of the oxide film formation laser light L5 (L8) extends horizontally.

The oxide film formation laser light L5 (L8) having reached the dichroic mirror 410 is mostly reflected by a mirror surface 410a of the dichroic mirror 410 and is partially transmitted through the dichroic mirror 410. The oxide film formation laser light L5 (L8) is reflected by the mirror surface 410a perpendicularly to the direction in which the oxide film formation laser light L5 (L8) emitted from the laser head 122 travels toward the dichroic mirror 410, and reaches the surface 62a of the lead frame 62.

A part of the reflected oxide film formation laser light L5 (L8) is then absorbed by the lead frame 62 through the surface 62a and is converted to heat. The remaining part of the reflected oxide film formation laser light L5 (L8) is reflected by the surface 62a, and the reflected laser light L5A (L8A) travels back toward the mirror surface 410a of the dichroic mirror 410 and reaches the mirror surface 410a tilted with respect to the surface 62a. Most of the reflected laser light L5A (L8A) having reached the mirror surface 410a of the dichroic mirror 410 is reflected again by the mirror surface 410a and travels parallel to the optical axis of the oxide film formation laser light L5 (L8) toward the laser head 122.

A part of the reflected laser light L5A (L8A) having reached the mirror surface 410a of the dichroic mirror 410 is transmitted through the dichroic mirror 410 and travels upward in FIG. 14. The power meter 330 placed on the upper side in FIG. 14 receives this transmitted laser light L5AA (L8AA) and measures the output of the transmitted laser light L5AA (L8AA). The actual absorption Abr of the oxide film OM can thus be estimated as in the third embodiment. This configuration has effects similar to those of the third embodiment.

Unlike the third embodiment, in the first modification of the third embodiment, the laser head 122 can be placed horizontally and the configuration can be simplified. Since the output of the transmitted laser light L5AA (L8AA) that is received by the power meter 330 is low, a small power meter can be used, which can contribute to cost reduction.

Figure 15:
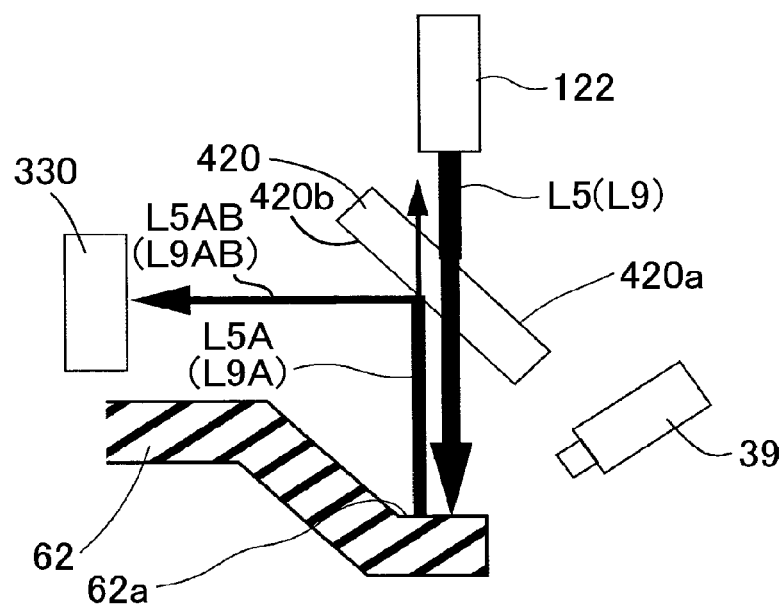
FIG. 15 is a diagram illustrating the configuration of a second modification of the third embodiment.

The present invention is not limited to the form of the first modification. In a second modification of the third embodiment, a dichroic mirror 420, the laser head 122, and the power meter 330 may be placed as shown in FIG. 15. In the second embodiment, the dichroic mirror 420 is placed between the laser head 122 having an optical axis extending in the vertical direction and the surface 62a of the lead frame 62, namely on the optical axis of the oxide film formation laser light L5 (actual absorption measuring laser light L9), so as to be tilted at about 45 degrees with respect to the surface 62a. The dichroic mirror 420 is different from the dichroic mirror 410 in the manner in which it transmits the oxide film formation laser light L5 (L9) therethrough or reflects the oxide film formation laser light L5 (L9).

In the second modification in which the dichroic mirror 420 is placed in this manner, as shown in FIG. 15, the oxide film formation laser light L5 (L9) is emitted from the laser head 122 placed such that its optical axis extends vertically toward the dichroic mirror 420.

Most of the oxide film formation laser light L5 (L9) having reached the dichroic mirror 420 is transmitted through a mirror surface 420a of the dichroic mirror 420. The oxide film formation laser light L5 (L9) transmitted through the mirror surface 420a reaches the surface 62a of the lead frame 62.

A part of the oxide film formation laser light L5 (L9) is then absorbed by the lead frame 62 through the surface 62a and is converted to heat. The remaining part of the oxide film formation laser light L5 (L9) is reflected by the surface 62a, and the reflected laser light L5A (L9A) travels back toward a mirror surface 420b of the dichroic mirror 420 and reaches the mirror surface 420b tilted with respect to the surface 62a. A part of the reflected laser light L5A (L9A) having reached the mirror surface 420b of the dichroic mirror 420 is reflected perpendicularly by the mirror surface 420a and travels toward the power meter 330. The power meter 330 placed on the left side in FIG. 15 receives the reflected laser light L5AB (L9AB) and measures the output of the reflected laser light L5AB (L9AB). The actual absorption Abr of the oxide film OM can thus be estimated as in the third embodiment. This configuration has effects similar to those of the third embodiment.

Unlike the third embodiment, in the second modification of the third embodiment, the laser head 122 can be placed vertically and the configuration can be simplified. As in the first modification of the third embodiment, since the output of the reflected laser light L5AB (L9AB) that is received by the power meter 330 is low, a small power meter can be used, which can contribute to cost reduction.

In the third embodiment, the oxide film formation laser light L5, the heating laser light L6, and the actual absorption measurement laser light L7 are switched to each other by the switching operation (output adjustment) that is performed by the single laser oscillator 121. However, the present invention is not limited to this. In a third modification of the third embodiment, a laser oscillator for the actual absorption measurement laser light L7 may be provided separately (not shown). This configuration is efficient since the actual absorption Abr can be measured simultaneously with emission of the oxide film formation laser light L5.

In the third embodiment, both the oxide film formation laser light L5 and the heating laser light L6 are a continuous wave CW. However, the present invention is not limited to this. In a fourth modification of the third embodiment, the oxide film formation laser light L5 may be a pulse wave PW and the heating laser light L6 may be a continuous wave CW. In a fifth modification of the third embodiment, the oxide film formation laser light L5 may be a continuous wave CW and the heating laser light L6 may be a pulse wave PW. In a sixth modification of the third embodiment, both the oxide film formation laser light L5 and the heating laser light L6 may be a pulse wave PW. These modifications have appropriate effects.

In the third embodiment, after emission of the oxide film formation laser light L5 in the oxide film formation laser light emitting step S111 for forming the oxide film OM is stopped, the actual absorption measurement laser light L7 (L5) is emitted to obtain the actual absorption Abr. However, the present invention is not limited to this. In a seventh modification of the third embodiment, during emission of the oxide film formation laser light L5 for forming the oxide film OM, the power meter 330 may simultaneously receive the reflected laser light L7A (L5A) of the actual absorption measurement laser light L7 (L5) to calculate the actual absorption Abr.

In the first to third embodiments, the laser light to be emitted is switched from the oxide film formation laser light L1, L3, L5 to the heating laser light L2, L4, L6 by adjusting the output of the oxide film formation laser light L1, L3, L5. However, the present invention is not limited to this. The control unit 140, 240, 340 may include an emitting unit that emits laser light with preset output, and the control unit 140, 240, 340 may switch between the oxide film formation laser light L1, L3, L5 and the heating laser light L2, L4, L6 by a switching operation that is performed by the emitting unit.

A bonding apparatus 400 that bonds two members by using the heating apparatus 100 of the first embodiment will be described. Bonding will be described with respect to an example in which a metal terminal of a semiconductor component 50, or a metal member to which another metal member is to be bonded, is bonded to the lead frame 62 described above as a member to be heated by known solid-phase diffusion bonding. Solid-phase diffusion bonding is a known bonding method in which a metal member (lead frame 62) and another metal member to which the metal member is to be bonded (metal terminal of the semiconductor component 50) are heated to form a solid phase that is formed at a temperature lower than that of a liquid phase and that allows bonding to be achieved in a solid state, and the first bonding surface 62b and a second bonding surface 50a are pressed and bonded together in a pressure bonding direction.

Figure 16:
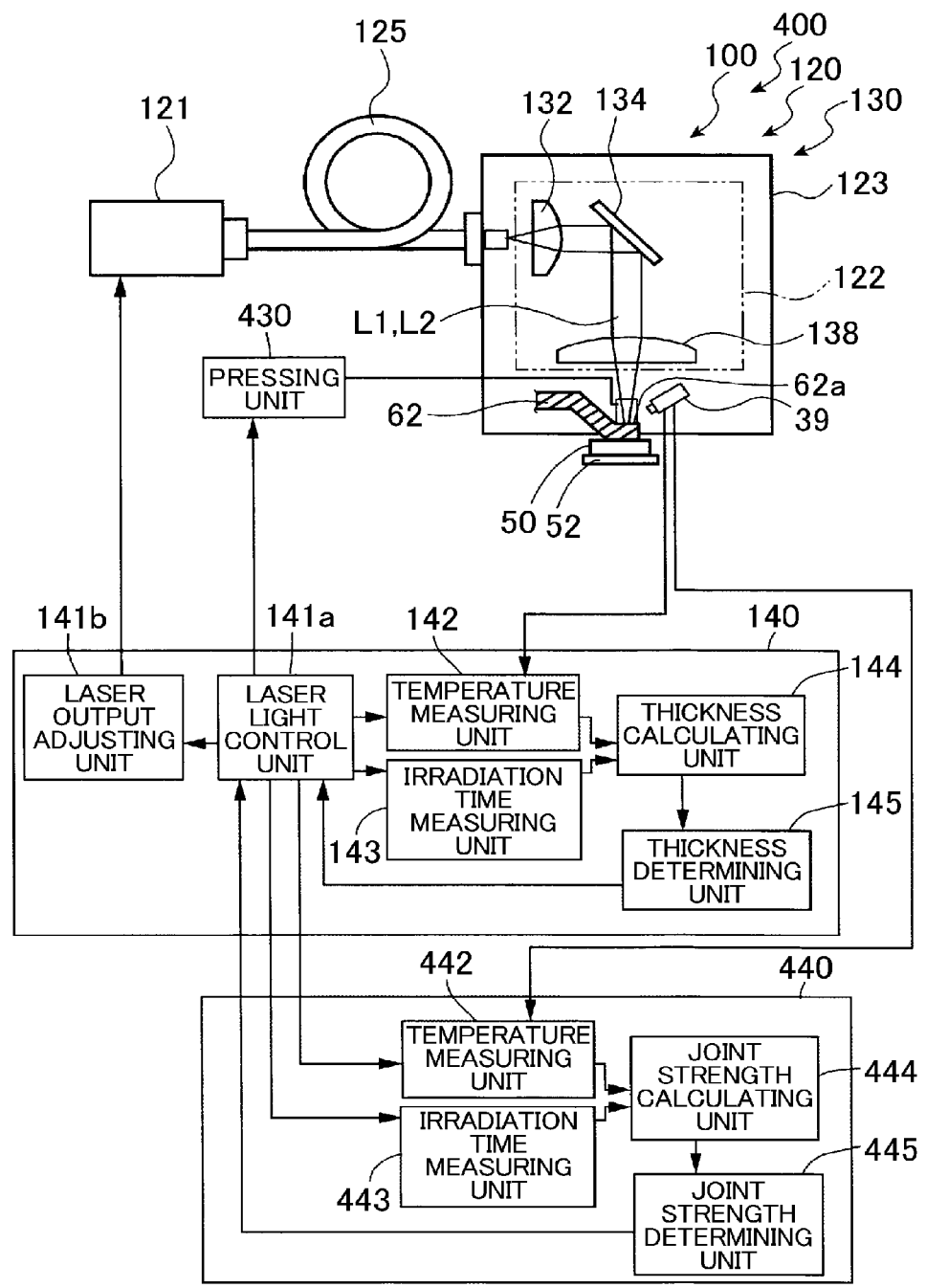
FIG. 16 is a schematic diagram of a bonding apparatus using the heating apparatus of the first embodiment.
Figure 17:
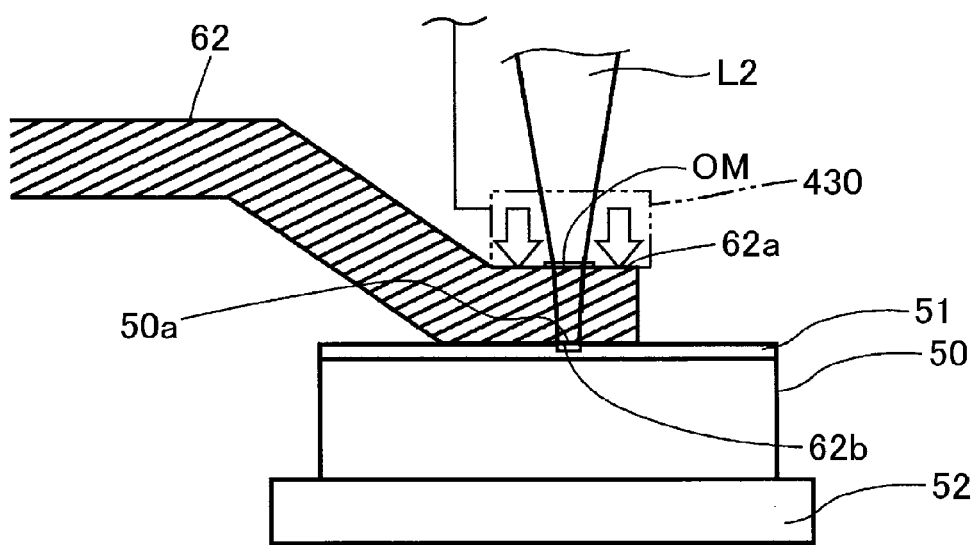
FIG. 17 is a partial enlarged view of FIG. 16.

Specifically, the first bonding surface 62b opposite to the surface 62a of the lead frame 62 is bonded to the second bonding surface 50a, or the upper surface of a metal layer 51 that is formed as a terminal on the upper surface of the semiconductor component 50 (see FIG. 17). For example, the metal layer 51 is made of gold (Au). As shown in FIGS. 16 and 17, the first bonding surface 62b and the second bonding surface 50a are in contact with each other before being bonded together. The lower surface of the semiconductor component 50 is supported by a predetermined support member 52. The lead frame 62 and the semiconductor component 50 are bonded together by pressing the surface 62a of the lead frame 62 in the direction in which the first bonding surface 62b and the second bonding surface 50a are pressure-bonded together (see arrows in FIG. 17).

As shown in FIG. 16, the bonding apparatus 400 is an apparatus using the heating apparatus 100 (the oxide film forming unit 120, the heating unit 130, and the control unit 140). The bonding apparatus 400 includes the heating apparatus 100, a pressing unit 430, and a control unit 440. The pressing unit 430 presses the surface 62a of the lead frame 62 in the direction in which the first bonding surface 62b and the second bonding surface 50a are pressure-bonded together (see the arrows in FIG. 17) when the heating unit 130 of the heating apparatus 100 irradiates the surface 62a of the lead frame 62 with the heating laser light L2 to heat the surface 62a.

In this case, the pressing may be performed by any means. The pressure that is applied to press the surface 62a of the lead frame 62 is a pressure that can achieve solid-state diffusion bonding, and is considered and determined in advance. In the present embodiment, pressing of the surface 62a of the lead frame 62 in the direction in which the first bonding surface 62b and the second bonding surface 50a are pressure-bonded together is started at the same time as the heating apparatus 100 is operated. The pressing unit 430 is controlled by the laser light control unit 141a of the control unit 140.

The control unit 440 includes a temperature measuring unit 442, an irradiation time measuring unit 443, a joint strength calculating unit 444, and a joint strength determining unit 445. Since the temperature measuring unit 442 has a function similar to that of the temperature measuring unit 142 of the control unit 140, the temperature measuring unit 142 may be also used as the temperature measuring unit 442. The temperature measuring unit 442 transmits the data of the measured temperature t of the surface 62a to the joint strength calculating unit 444 of the control unit 440. The irradiation time measuring unit 443 measures the irradiation time h of the surface 62a with the heating laser light L2. The irradiation time measuring unit 443 transmits data of the measured irradiation time h to the joint strength calculating unit 444 of the control unit 440.

The joint strength calculating unit 444 calculates joint strength F in the solid-phase diffusion bonding between the first bonding surface 62b and the second bonding surface 50a based on the surface temperature t and the irradiation time h obtained by the temperature measuring unit 442 and the irradiation time measuring unit 443.

The joint strength determining unit 445 determines if the joint strength F calculated by the joint strength calculating unit 444 has reached predetermined joint strength F1. That is, the joint strength determining unit 445 determines if the first bonding surface 62b and the second bonding surface 50a have been bonded together with the joint strength F predetermined joint strength F1).

A bonding method using the bonding apparatus 400 will be described with reference to the fourth flowchart of FIG. 18. As shown in the fourth flowchart of FIG. 18, the bonding method includes an oxide film forming step S110 and a heating step S120A. The oxide film forming step S110 is similar to the oxide film forming step S110 of the heating method described above. However, the heating step S120A is partially different from the heating step S120 of the heating method of the first embodiment. Accordingly, the fourth flowchart of FIG. 18 does not show the details of the oxide film forming step S110 and shows only the heating step S120A in detail. In the following description, only the heating step S120A will be described in detail. The configurations and steps similar to those of the heating method described in the above embodiment will be denoted with the same reference characters as those of the above embodiment.

Figure 18:
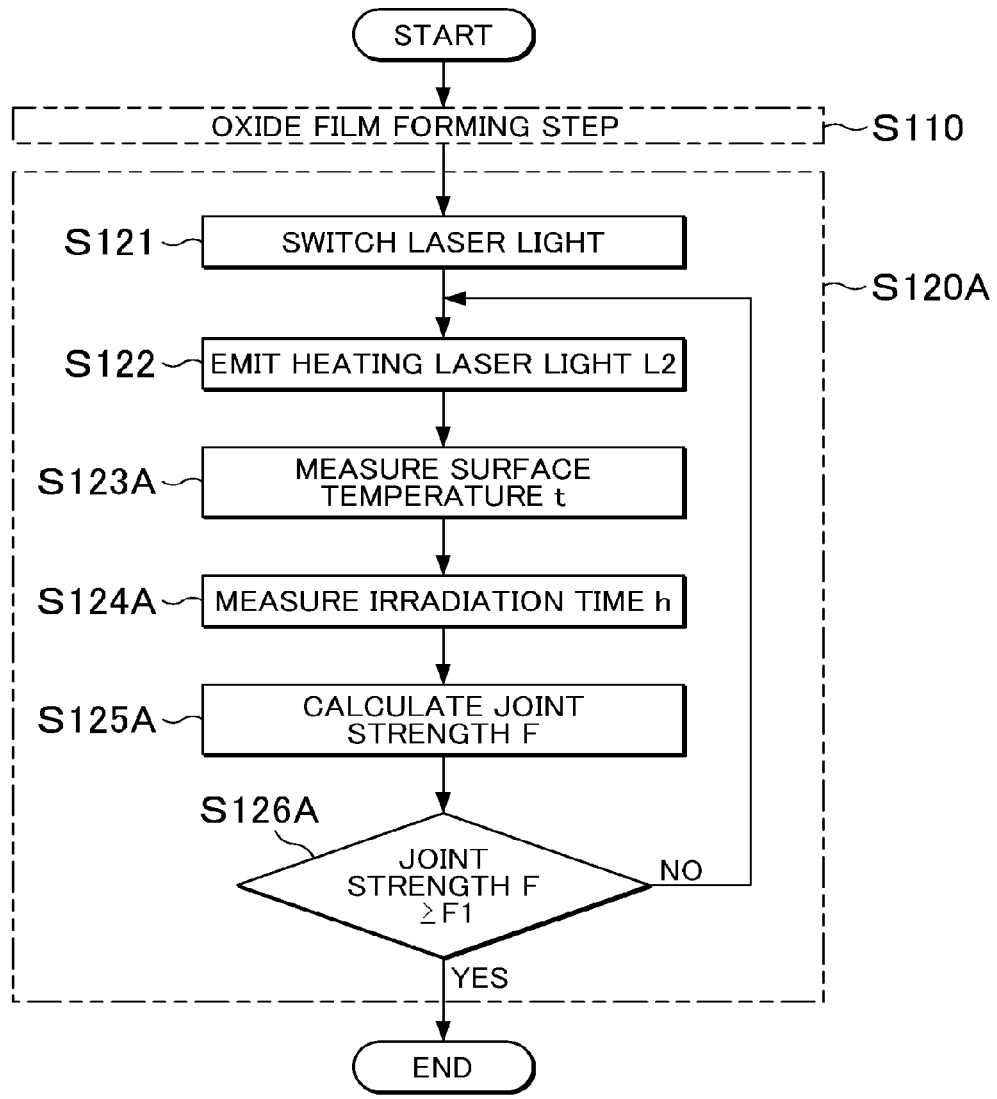
FIG. 18 is a fourth flowchart illustrating a bonding method using the bonding apparatus of FIG. 16.

As shown in the fourth flowchart of FIG. 18, the heating step S120A of the bonding method includes a switching step S121, a heating laser light emitting step S122, a temperature measuring step S123A, an irradiation time measuring step S124A, a joint strength calculating step S125A, and a joint strength determining step S126A.

In the switching step S121, if it is determined in the thickness determining step S115 of the oxide film forming step S110 that the estimated thickness α1 has reached (the range of) the predetermined thickness α, the laser output adjusting unit 141b (laser light control unit 141a) adjusts the output of the oxide film formation laser light L1 to switch laser light emission from the oxide film formation laser light L1 to the heating laser light L2.

In the heating laser light emitting step S122, the surface 62a of the lead frame 62 is irradiated with the heating laser light L2 through the oxide film OM by control of the laser output adjusting unit 141b. In the temperature measuring step S123A, the surface temperature t of the lead frame 62 is measured with the infrared thermometer 39, and the measurement data is transmitted to the joint strength calculating unit 444 of the control unit 440. In the irradiation time measuring step S124A, the irradiation time h of the surface 62a with the heating laser light L2 is measured, and the measurement data is transmitted to the joint strength calculating unit 444 of the control unit 440.

In the joint strength calculating step S125A, the joint strength F between the first bonding surface 62b and the second bonding surface 50a is calculated based on the surface temperature t and the irradiation time h obtained in the temperature measuring step S123A and the irradiation time measuring step S124A. At this time, in the joint strength calculating step S125A, the temperatures of the first bonding surface 62b and the second bonding surface 50a are first estimated from the temperature t of the surface 62a and the irradiation time h. The joint strength F is estimated based on the estimated temperatures and the relationship between the temperatures of the first bonding surface 62b and the second bonding surface 50a and the joint strength F that is stored in advance in the control unit 440. The present invention is not limited to this, and the joint strength F may be calculated in any manner.

Subsequently, if it is determined in the joint strength determining step S126A that the estimated joint strength F has not reached the predetermined joint strength F1, the routine returns to the heating laser light emitting step S122, and the steps S122 to S126A are repeated until it is determined in the joint strength determining step S126A that the estimated joint strength F has reached the predetermined joint strength F1. If it is determined in the joint strength determining step S126A that the estimated joint strength F has reached the predetermined joint strength F1, the laser output adjusting unit 141b stops emission of the heating laser light L2, and the program is terminated.

The above bonding method includes the joint strength calculating step S125A and the joint strength determining step S126A, and emission of the heating laser light L2 is stopped when it is determined that the joint strength F has reached the predetermined joint strength F1. However, the present invention is not limited to this. The bonding method may not include the joint strength calculating step S125A and the joint strength determining step S126A. In this case, in the bonding method, whether bonding has been completed or not is determined by only the measurement data (surface temperature t) obtained in the temperature measuring step S123A. This also has appropriate effects.

In this case, the temperature ta of the surface 62a that is used to determine if bonding has been completed is the temperature of the surface 62a at the time the first bonding surface 62b and the second bonding surface 50a form a solid phase and solid-phase diffusion bonding has been completed with the first bonding surface 62b and the second bonding surface 50a being pressed together in the pressure-bonding direction. This surface temperature ta is also considered and set in advance.

The above bonding method is described with respect to the case in which the first bonding surface 62b and the second bonding surface 50a are bonded together by solid-phase diffusion bonding. However, the present invention is not limited to this form. In a bonding method in another form, the first bonding surface 62b and the second bonding surface 50a may be bonded together in a liquid phase (melted state). In this case, the lead frame 62 need not be pressed in the direction in which the lead frame 62 is pressure-bonded to the semiconductor component 50.

In this case as well, completion of bonding is determined based on the surface temperature t measured in the temperature measuring step S123A or the joint strength F calculated in the joint strength calculating step S125A. As in the case described above, the surface temperature ta that is used to determine if bonding has been completed is the temperature of the surface 62a that allows it to confirm that the first bonding surface 62b and the second bonding surface 50a have been bonded together in a liquid phase. This surface temperature ta is also considered and determined in advance. It should be understood that, for determination of whether the joint strength F has reached the predetermined joint strength F1 or not, the relationship between the surface temperature t and the joint strength F is obtained in advance and this determination is made based on this relationship.

According to the first to third embodiments, the method for heating the lead frame 62 (metal member) by irradiation with the heating laser light L2 includes: the oxide film forming step S110 of forming the oxide film OM with the predetermined thickness α on the surface 62a of the lead frame 62 (metal member); and the heating step S120 of irradiating the surface 62a of the lead frame 62 (metal member) with the heating laser light L2 through the oxide film OM and causing the lead frame 60 (metal member) to absorb the heating laser light L2 with absorption corresponding to the predetermined thickness α of the oxide film OM to heat the lead frame 62 (metal member) to the predetermined surface temperature Ta, ta.

The absorption has such characteristics that, in the relationship with the thickness of the oxide film OM, the absorption has a periodic profile with maximal and minimal values appearing alternately as the thickness increases, and that the absorption is the lowest when the thickness of the oxide film OM is zero. The predetermined thickness α of the oxide film OM that is formed in the oxide film forming step S110 is set in the first range Ar1 that includes the first maximal thickness A and the second maximal thickness B and that is smaller than the second minimal thickness BB in the relationship with the absorption having the periodic profile. The first maximal thickness A corresponds to the first maximal value a of the absorption, namely the maximal value of the absorption that first appears after the thickness of the oxide film OM increases from zero. The second maximal thickness B corresponds to the second maximal value b of the absorption, namely the maximal value of the absorption that appears subsequent to the first maximal value a. The second minimal thickness BB corresponds to the second minimal value bb of the absorption, namely the minimal value of the absorption that appears between the second maximal value b and the third maximal value c, or the maximal value of the absorption that appears subsequent to the second maximal value b.

As described above, the absorption of the heating laser light L2 by the lead frame 62 (metal member) has such characteristics that, in the relationship with the thickness of the oxide film OM, the absorption has a periodic profile with maximal and minimal values appearing alternately, and that the absorption is the lowest when the thickness of the oxide film OM is zero. The thickness of the oxide film OM of the lead frame 62 (metal member) is set in the first range Ar1 (35 nm to 360 nm) that includes the first maximal thickness A and the second maximal thickness B and that is smaller than the second minimal thickness BB. The first maximal thickness A corresponds to the first maximal value a, or the maximal value of the absorption that first appears after the thickness of the oxide film OM increases from zero. The second maximal thickness B corresponds to the second maximal value b of the absorption that appears subsequent to the first maximal value a. The second minimal thickness BB corresponds to the second minimal value bb of the absorption, namely the minimal value of the absorption that appears between the second maximal value b and the third maximal value c, or the maximal value of the absorption that appears subsequent to the second maximal value b.

Accordingly, even if the thickness of the oxide film OM varies slightly, the absorption of the heating laser light L2 can be reliably increased and the lead frame 62 (metal member) can be stably and efficiently heated as compared to the case where the lead frame 62 (metal member) is irradiated with the heating laser light L2 without through the oxide film OM. Since the thickness of the oxide film OM is limited to the first range Ar1 near zero, the oxide film OM is not formed with a thickness larger than the first range Ar1, which reduces the waste of time.

According to the first to third embodiments, in the case where the lead frame 62, or the metal member, is made of copper and the thickness of the oxide film OM is measured by SERA, the predetermined thickness α of the oxide film OM is set in the first range Ar1 of 35 nm to 360 nm. Accordingly, the absorption of the heating laser light L2 by the lead frame 62 (metal member) is reliably increased as compared to the case where there is no oxide film. The lead frame 62 (metal member) can therefore be efficiently heated.

According to the first to third embodiments, in the oxide film forming step S110, S210 of the heating method, the oxide film OM is formed by irradiating the surface 62a of the lead frame 62 (metal member) with the oxide film formation laser light L1, L3, L5 under the predetermined irradiation conditions. This is efficient since the same heating apparatus 100, 200, 300 can be used for both the oxide film forming step S110, S210 and the heating step S120.

According to the first to third embodiments, in the oxide film forming step S110, S210 of the heating method, the surface 62a of the lead frame 62 (metal member) is irradiated with the oxide film formation laser light L1 to form the hole 62c at the irradiated position of the surface 62a. In the heating step S120, a part of the heating laser light L2 is thus introduced into the hole 62c, whereby the side surface of the hole 62c can be irradiated with the heating laser light L2 and can absorb the heating laser light L2. The lead frame 62 (metal member) can thus be heated more efficiently.

According to the heating methods of the first to third embodiments, the oxide film formation laser light L1, L3, L5 and the heating laser light L2, L4, L6 are the same kind of laser light (near-infrared laser light). The heating apparatus 100, 200, 300 can therefore be manufactured at low cost.

According to the first and third embodiments, both the oxide film formation laser light L1, L5 and the heating laser light L2, L6 are a continuous wave CW. The heating apparatus 100, 300 can therefore be manufactured at low cost.

According to the second embodiment, the oxide film formation laser light L1 is a pulse wave PW, and the heating laser light L2 is a continuous wave CW. Since the irradiation manner with the laser light is varied between the different purposes, namely formation of the oxide film and heating, formation of the oxide film and heating can be implemented efficiently.

According to the first to third embodiments, the oxide film forming step S110, S210, S310 of the heating method includes: the temperature measuring step S112, S212 of measuring the temperature T, t of the surface 62a of the lead frame 62 (metal member) when the surface 62a is irradiated with the oxide film formation laser light L1, L3, L5; the irradiation time measuring step S113, S213 of measuring the irradiation time H, h of the surface 62a with the oxide film formation laser light L1; the thickness calculating step S114, S214 of calculating the accumulated thickness of the oxide film OM formed on the surface 62a of the lead frame 62 (metal member) based on the measured surface temperature T, t and the measured irradiation time H, h; and the thickness determining step S115, S215 of determining if the thickness (accumulated thickness) of the oxide film OM calculated in the thickness calculating step S114, S214 has reached the predetermined thickness α.

The heating step S120 includes: the switching step S121 of switching laser light emission from the oxide film formation laser light L1 to the heating laser light L2 if it is determined in the thickness determining step S115 that the accumulated thickness has reached the predetermined thickness α; and the heating laser light emitting step S122 of irradiating the surface 62a of the lead frame 62 (metal member) with the heating laser light L2 through the oxide film OM to heat the lead frame 62 (metal member) to the predetermined surface temperature Ta. The lead frame 62 (metal member) is thus heated more efficiently, more accurately, and more stably.

According to the heating method of the third embodiment, the oxide film forming step S310 includes: the temperature measuring step S112 of measuring the temperature of the surface 62a of the lead frame 62 (metal member) when the surface 62a is irradiated with the oxide film formation laser light L5; the irradiation time measuring step S113 of measuring the irradiation time of the surface 62a with the oxide film formation laser light L5; the thickness calculating step S114 of calculating the thickness of the oxide film OM formed on the surface 62a of the lead frame 62 (metal member) as the estimated thickness based on the measured surface temperature and the measured irradiation time; the actual absorption measurement laser light emitting step S312 of irradiating the surface 62a of the lead frame 62 (metal member) that have the oxide film OM formed thereon with the actual absorption measurement laser light L7 through the oxide film OM; the reflected laser light output measuring step S313 of measuring the output of the reflected laser light L7A, or the actual absorption measurement laser light L7 emitted in the actual absorption measurement laser light emitting step S312 and reflected by the surface 62a; the actual absorption calculating step S314 of calculating the actual absorption Abr of the heating laser light L6 by the surface 62a of the lead frame 62 (metal member) that has the oxide film OM formed thereon, based on the magnitude of the output of the reflected laser light L7A measured in the reflected laser light output measuring step S313; and the oxide film formation laser light irradiation condition changing step S317 of changing the predetermined irradiation conditions with the oxide film formation laser light L5 based on the estimated thickness, the actual absorption Abr, and the relationship between the thickness of the oxide film and the absorption having the periodic profile. Since the oxide film OM is thus formed while checking the estimated thickness, the actual absorption Abr, and the relationship between the thickness of the oxide film and the absorption having the periodic profile, the oxide film OM having desired absorption is more likely to be formed.

According to the heating method of the third embodiment, the oxide film forming step S310 includes the estimated absorption calculating step S311 of calculating the estimated absorption Abe of the heating laser light L6 that corresponds to the estimated thickness calculated in the thickness calculating step S114 based on the relationship between the thickness of the oxide film and the absorption having the periodic profile. In the oxide film formation laser light irradiation condition changing step S317, the irradiation conditions with the oxide film formation laser light L5 are changed based on the estimated absorption Abe calculated in the estimated absorption calculating step S311 and the actual absorption Abr corresponding to the oxide film OM that had been formed at the time the estimated absorption Abe was calculated. Since the oxide film OM is thus formed based on the estimated absorption Abe and the actual absorption Abr, the oxide film OM having desired absorption is more likely to be formed.

According to the heating method of the third embodiment, the oxide film forming step S310 includes: the absorption difference calculating step S315 of calculating the difference ΔAb between the estimated absorption Abe calculated in the estimated absorption calculating step S311 and the actual absorption Abr corresponding to the oxide film OM that had been formed at the time the estimated absorption Abe was calculated; and the absorption difference determining step S316 of determining if the calculated absorption difference ΔAb is in the predetermined range β. If it is determined in the absorption difference determining step S316 that the absorption difference ΔAb is not in the predetermined range β, the predetermined irradiation conditions with the oxide film formation laser light L5 are changed according to the magnitude of the absorption difference ΔAb so that the absorption difference ΔAb falls within the predetermined range β in the oxide film formation laser light irradiation condition changing step S317. The oxide film OM having desired laser absorption is thus reliably formed.

According to the first to third embodiments, the heating apparatus 100, 200, 300 includes: the oxide film forming unit 120, 220 320 that forms the oxide film OM with the predetermined thickness α on the surface 62a of the lead frame 62 (metal member); and the heating unit 130 that irradiates the lead frame 62 (metal member) with the heating laser light L2, L4, L6 through the oxide film OM formed with the predetermined thickness α and causes the lead frame 62 (metal member) to absorb the heating laser light L2, L4, L6 with the absorption corresponding to the predetermined thickness α of the oxide film OM to heat the lead frame 62 (metal member) to the predetermined surface temperature Ta, ta.

The absorption has such characteristics that, in the relationship with the thickness of the oxide film OM, the absorption has a periodic profile with maximal and minimal values appearing alternately as the thickness increases, and that the absorption is the lowest when the thickness of the oxide film OM is zero. The predetermined thickness α of the oxide film OM that is formed by the oxide film forming unit 120, 220, 320 is set in the first range Ar1 that includes the first maximal thickness A and the second maximal thickness B and that is smaller than the second minimal thickness BB in the relationship with the absorption having the periodic profile. The first maximal thickness A corresponds to the first maximal value a of the absorption, namely the maximal value of the absorption that first appears after the thickness of the oxide film OM increases from zero. The second maximal thickness B corresponds to the second maximal value b of the absorption, namely the maximal value of the absorption that appears subsequent to the first maximal value a. The second minimal thickness BB corresponds to the second minimal value bb of the absorption, namely the minimal value of the absorption that appears between the second maximal value b and the third maximal value c, or the maximal value of the absorption that appears subsequent to the second maximal value b. The heating apparatus 100, 200, 300 can perform efficient heating similar to that of the heating method.

According to the third embodiment, the oxide film forming unit 320 of the heating apparatus 300 forms the oxide film OM by irradiating the surface 62a of the lead frame 62 (metal member) with the oxide film formation laser light L5 under the predetermined irradiation conditions. The oxide film forming unit 320 includes: the temperature measuring unit 142 that measures the temperature of the surface 62a of the lead frame 62 (metal member) when the surface 62a is irradiated with the oxide film formation laser light L5; the irradiation time measuring unit 143 that measures the irradiation time of the surface 62a with the oxide film formation laser light L5; the thickness calculating unit 144 that calculates the thickness of the oxide film OM formed on the surface 62a of the lead frame 62 (metal member) as the estimated thickness, based on the measured surface temperature and the measured irradiation time; the actual absorption measurement laser light emitting unit (laser output adjusting unit 141b) that irradiates the surface 62a of the lead frame 62 (metal member) that has the oxide film OM formed thereon with the actual absorption measurement laser light L7 through the oxide film OM; the reflected laser light output measuring unit 346 that measures the output of the reflected laser light L7A, or the actual absorption measurement laser light L7 emitted from the actual absorption measurement laser light emitting unit (laser output adjusting unit 141b) and reflected from the surface 62a; the actual absorption calculating unit 347 that calculates the actual absorption of the heating laser light L6 by the surface 62a of the lead frame 62 (metal member) that has the oxide film OM formed thereon, based on the magnitude of the output of the reflected laser light L7A measured by the reflected laser light output measuring unit 346; and the oxide film formation laser light irradiation condition changing unit 351 that changes the predetermined irradiation conditions with the oxide film formation laser light L5 based on the estimated thickness, the actual absorption Abr, and the relationship between the thickness of the oxide film OM and the absorption Ab having the periodic profile. The heating apparatus 300 can thus perform heating so as to have effects similar to those of the heating method of the third embodiment.

The bonding method using the bonding apparatus 400 of the above embodiment is a method for bonding the first bonding surface 62b of the lead frame 62 (metal member) that is opposite to the surface 62a of the lead frame 62 and the second bonding surface 50a that contacts the first bonding surface 62b, namely the second bonding surface 50a of another metal member to which the lead frame 62 is to be bonded. In this bonding method, the lead frame 62 (metal member) is heated to the predetermined temperature by the heating method of the first to third embodiments so that the first bonding surface 62b and the second bonding surface 50a form a solid phase that is formed at a temperature lower than that of a liquid phase and that allows bonding to be achieved in a solid state, and the first bonding surface 62b and the second bonding surface 50a are pressed and bonded together in the pressure-bonding direction.

As described above, the first bonding surface 62b and the second bonding surface 50a are heated to a solid phase, or to a temperature lower than that at which the lead frame 62 (metal member) made of copper is melted, and are bonded together. Accordingly, a required amount of irradiation with the heating laser light L2 is reduced as compared to the case where the lead frame 62 (metal member) is melted for bonding. Moreover, the oxide film OM is formed on the lead frame 62 (metal member) in the oxide film forming step S110, S210, S310 to improve the absorption of the heating laser light L2 Accordingly, the required amount of energy of the heating laser light L2 can be significantly reduced, and cost for bonding can be reduced.

In the first to third embodiments, the predetermined thickness α of the oxide film OM that is formed on the surface 62a of the lead frame 62 (metal member) is set in the first range Ar1 that includes the first maximal thickness A and the second maximal thickness B and that is smaller than the second minimal thickness BB in the relationship with the absorption having the periodic profile. The first maximal thickness A corresponds to the first maximal value a of the absorption, namely the maximal value of the absorption that first appears after the thickness of the oxide film OM increases from zero. The second maximal thickness B corresponds to the second maximal value b of the absorption, namely the maximal value of the absorption that appears subsequent to the first maximal value a. The second minimal thickness BB corresponds to the second minimal value bb of the absorption, namely the minimal value of the absorption that appears between the second maximal value b and the third maximal value c, or the maximal value of the absorption that appears subsequent to the second maximal value b.

However, the present invention is not limited to this. As shown in the graph of FIG. 6, the predetermined thickness α of the oxide film OM may be set in a second range Ar2 or a third range Ar3. The second range Ar2 is the range that includes the first maximal thickness A and that is smaller than a first minimal thickness AA corresponding to a first minimal value aa, or the minimal value of the absorption that appears between the first maximal value a and the second maximal value b of the absorption. The third range Ar3 is the range that includes the second maximal thickness B and that is larger than the first minimal thickness AA and smaller than the second minimal thickness BB. The range of the predetermined thickness α is thus reduced and stabilized as compared to the range set in the above embodiment, and the average value of the absorption is increased, whereby a more efficient heating result can be obtained.

In the above embodiment in which the metal member is made of copper and the thickness of the oxide film OM is measured by SERA, the predetermined thickness α of the oxide film OM is set in the first range Ar1 of 35 nm to 360 nm. However, the present invention is not limited to this, and the predetermined thickness α of the oxide film OM may be set in the second range Ar2 of 35 nm to 135 or the third range Ar3 of 165 nm to 360 nm. The thickness α is thus stabilized and the average value of the absorption is increased, whereby a more efficient heating result can be obtained.

In the first to third embodiments, the metal member is the lead frame 62 made of copper. However, the metal member is not limited to copper, and may be made of a metal such as aluminum or iron. In the case where the metal member is made of aluminum or iron, the laser absorption-oxide film thickness characteristics to be used by the oxide film forming unit 120, 220, 320 and the heating unit 130 vary depending on the metal used for the metal member. In this case, the predetermined thickness α is newly set based on the laser absorption-oxide film thickness characteristics corresponding to the metal used for the metal member.

In the first to third embodiments, the oxide film OM is formed by irradiating the surface 62a of the lead frame 62 (metal member) with the oxide film formation laser light L1, L3, L5 in the oxide film forming step S110, S210, S310. However, the present invention is not limited to this. For example, the oxide film OM may be heated in a heating furnace. In this case, the efficiency in forming the oxide film OM is reduced. However, when looking at the heating step S120, this heating method has effects similar to those of the above embodiment.

The heating method using the heating apparatus 100, 200, 300 of the first to third embodiments can be used to cut or mark a member made of copper, iron, aluminum, etc. The above heating method and the bonding method can be used to stack a metal member made of copper, iron, aluminum, etc. by a three-dimensional (3D) printer.

Figure 11:
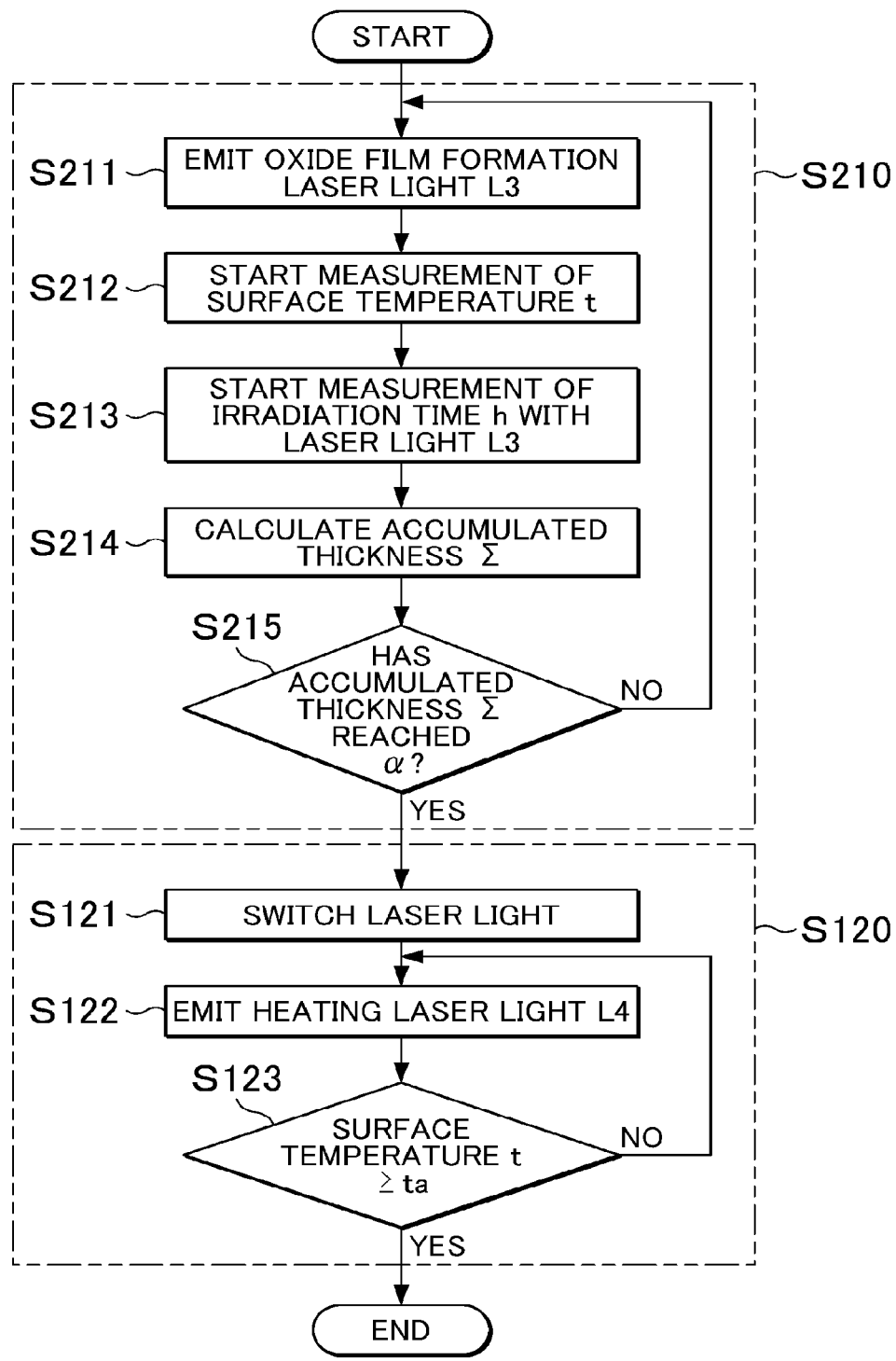
FIG. 11 is a second flowchart illustrating a heating method according to the second embodiment.

In the second embodiment, in the second flowchart of FIG. 11 illustrating the heating method of the embodiment, in the case where the accumulated thickness Σ of the oxide film OM has not reached the predetermined thickness α in S215 and the routine returns (proceeds) to the oxide film formation laser light emitting step S211, the oxide film formation laser light L1 need not necessarily be emitted with the same number of pulses as in the previous emission. The oxide film formation laser light L3 may be emitted with the number of pulses changed so as to be suitable for forming such an oxide film that the accumulated thickness Σ reaches the predetermined thickness α.

Although the bonding apparatus 400 and the bonding method described above are described as using the heating apparatus 100 of the first embodiment, the present invention is not limited to this. The bonding apparatus 400 and the bonding method may use the heating apparatus 200 of the second embodiment or the heating apparatus 300 of the third embodiment.

What is claimed is:

1. A heating method for heating a metal member by irradiation with a heating laser light, comprising:
   an oxide film forming step of forming an oxide film with a predetermined thickness on a surface of the metal member; and
   a heating step of irradiating the metal member with the heating laser light through the oxide film and causing the metal member to absorb the heating laser light with absorption corresponding to the predetermined thickness of the oxide film to heat the metal member to a predetermined temperature; wherein
   the absorption has such characteristics that, in a relationship with a thickness of the oxide film, the absorption has a periodic profile with maximal and minimal values appearing alternately as the thickness increases, and that the absorption is the lowest when the thickness of the oxide film is zero, and
   the predetermined thickness of the oxide film that is formed with a thickness larger than zero in the oxide film forming step is set in a first range that includes a first maximal thickness and a second maximal thickness and that is smaller than a second minimal thickness in the relationship with the absorption having the periodic profile, the first maximal thickness corresponds to a first maximal value of the absorption, or the maximal value of the absorption that first appears after the thickness of the oxide film increases from zero, the second maximal thickness corresponds to a second maximal value of the absorption, or the maximal value of the absorption that appears subsequent to the first maximal value, and the second minimal thickness corresponds to a second minimal value of the absorption, or the minimal value of the absorption that appears between the second maximal value and a third maximal value, or the maximal value of the absorption that appears subsequent to the second maximal value.

2. The heating method according to claim 1, wherein the predetermined thickness of the oxide film is set in a second range or a third range, the second range is a range that includes the first maximal thickness and that is smaller than a first minimal thickness corresponding to a first minimal value, or the minimal value of the absorption that appears between the first maximal value and the second maximal value of the absorption, and the third range is a range that includes the second maximal thickness and that is larger than the first minimal thickness and smaller than the second minimal thickness.

3. The heating method according to claim 1, wherein the metal member is made of copper, and
   when the thickness of the oxide film is measured by sequential electrochemical reduction analysis, the predetermined thickness of the oxide film is set in the first range of 35 nm to 360 nm.

4. The heating method according to claim 2, wherein
the metal member is made of copper, and
when the thickness of the oxide film is measured by sequential electrochemical reduction analysis, the predetermined thickness of the oxide film is set in the second range of 35 nm to 135 nm or the third range of 165 nm to 360 nm.

5. The heating method according to claim 1, wherein
in the oxide film forming step, the oxide film is formed by irradiating the surface of the metal member with an oxide film formation laser light under predetermined irradiation conditions.

6. The heating method according to claim 5, wherein
in the oxide film forming step, the surface of the metal member is irradiated with the oxide film formation laser light to form a hole at an irradiated position.

7. The heating method according to claim 5, wherein
the oxide film formation laser light and the heating laser light are the same kind of laser light.

8. The heating method according to claim 5, wherein
both the oxide film formation laser light and the heating laser light are a continuous wave.

9. The heating method according to claim 5, wherein
the oxide film formation laser light is a pulse wave, and the heating laser light is a continuous wave.

10. The heating method according to claim 5, wherein
the oxide film forming step includes
  a temperature measuring step of measuring a temperature of the surface of the metal member when the surface is irradiated with the oxide film formation laser light,
  an irradiation time measuring step of measuring an irradiation time of the surface with the oxide film formation laser light,
  a thickness calculating step of calculating the thickness of the oxide film formed on the surface of the metal member as an estimated thickness based on the measured surface temperature and the measured irradiation time, and
  a thickness determining step of determining if the estimated thickness of the oxide film calculated in the thickness calculating step has reached the predetermined thickness, and
the heating step includes
  a switching step of switching laser light emission from the oxide film formation laser light to the heating laser light if it is determined in the thickness determining step that the estimated thickness has reached the predetermined thickness, and
  a heating laser light emitting step of irradiating the surface of the metal member with the heating laser light through the oxide film to heat the metal member to the predetermined temperature.

11. The heating method according to claim 5, wherein
the oxide film forming step includes
a temperature measuring step of measuring a temperature of the surface of the metal member when the surface is irradiated with the oxide film formation laser light,
an irradiation time measuring step of measuring an irradiation time of the surface with the oxide film formation laser light,
a thickness calculating step of calculating the thickness of the oxide film formed on the surface of the metal member as an estimated thickness based on the measured surface temperature and the measured irradiation time,
a thickness determining step of determining if the estimated thickness of the oxide film calculated in the thickness calculating step has reached the predetermined thickness,
an actual absorption measurement laser light emitting step of irradiating the surface of the metal member with actual absorption measurement laser light through the oxide film whose estimated thickness has been determined to have reached the predetermined thickness in the thickness determining step,
a reflected laser light output measuring step of measuring output of reflected laser light, or the actual absorption measurement laser light emitted in the actual absorption measurement laser light emitting step and reflected by the surface,
an actual absorption calculating step of calculating actual absorption of the heating laser light by the surface of the metal member that has the oxide film formed thereon, based on a magnitude of the output of the reflected laser light measured in the reflected laser light output measuring step, and
an oxide film formation laser light irradiation condition changing step of changing the predetermined irradiation conditions with the oxide film formation laser light based on the estimated thickness, the actual absorption, and the relationship between the thickness of the oxide film and the absorption having the periodic profile.

12. The heating method according to claim 11, wherein
the oxide film forming step includes an estimated absorption calculating step of calculating estimated absorption of the heating laser light that corresponds to the estimated thickness of the oxide film that has been determined to have reached the predetermined thickness in the thickness determining step, based on the relationship between the thickness of the oxide film and the absorption having the periodic profile, and
in the oxide film formation laser light irradiation condition changing step, the irradiation conditions with the oxide film formation laser light are changed based on the estimated absorption calculated in the estimated absorption calculating step and the actual absorption corresponding to the oxide film that had been formed at the time the estimated absorption was calculated.

13. The heating method according to claim 12, wherein
the oxide film forming step includes
an absorption difference calculating step of calculating a difference between the estimated absorption calculated in the estimated absorption calculating step and the actual absorption corresponding to the oxide film that had been formed at the time the estimated absorption was calculated, and
an absorption difference determining step of determining if the calculated absorption difference is in a predetermined range, and
if it is determined in the absorption difference determining step that the absorption difference is not in the predetermined range, the predetermined irradiation conditions with the oxide film formation laser light are changed according to a magnitude of the absorption difference so that the absorption difference falls within the predetermined range in the oxide film formation laser light irradiation condition changing step.

14. A method for bonding a first bonding surface of a metal member that is opposite to a surface of the metal member and a second bonding surface that contacts the first bonding surface, or the second bonding surface of another metal member to which the metal member is to be bonded, wherein the metal members are heated to the predetermined temperature by the heating method according to claim 1 so that the first bonding surface and the second bonding surface form a solid phase that is formed at a temperature lower than that of a liquid phase and that allows bonding to be achieved in a solid state, and the first bonding surface and the second bonding surface are pressed and bonded together in a pressure-bonding direction.

15. A heating apparatus for heating a metal member by irradiation with a heating laser light, comprising:

an oxide film forming unit that forms an oxide film with a predetermined thickness on a surface of the metal member, the oxide film forming unit forming the oxide film by irradiating the surface of the metal member with an oxide film formation laser light under predetermined irradiation conditions, the oxide film forming unit including an oxide film formation laser light control unit configured to control the oxide film formation laser light; and a heating unit that irradiates the metal member with the heating laser light through the oxide film formed with the predetermined thickness and causes the metal member to absorb the heating laser light with absorption corresponding to the predetermined thickness of the oxide film to heat the metal member to a predetermined temperature; wherein the absorption has such characteristics that, in a relationship with a thickness of the oxide film, the absorption has a periodic profile with maximal and minimal values appearing alternately as the thickness increases, and that the absorption is the lowest when the thickness of the oxide film is zero, and the oxide film formation laser light control unit is configured to control the oxide film formation laser light such that the predetermined thickness of the oxide film that is formed with a thickness larger than zero by the oxide film formation laser light is set in a first range that includes a first maximal thickness and a second maximal thickness and that is smaller than a second minimal thickness in the relationship with the absorption having the periodic profile, the first maximal thickness corresponds to a first maximal value of the absorption, or the maximal value of the absorption that first appears after the thickness of the oxide film increases from zero, the second maximal thickness corresponds to a second maximal value of the absorption, or the maximal value of the absorption that appears subsequent to the first maximal value, and the second minimal thickness corresponds to a second minimal value of the absorption, or the minimal value of the absorption that appears between the second maximal value and a third maximal value, or the maximal value of the absorption that appears subsequent to the second maximal value.

16. The heating apparatus according to claim 15, wherein the oxide film forming unit includes a temperature measuring unit that measures a temperature of the surface of the metal member when the surface is irradiated with the oxide film formation laser light, an irradiation time measuring unit that measures an irradiation time of the surface with the oxide film formation laser light, a thickness calculating unit that calculates the thickness of the oxide film formed on the surface of the metal member as an estimated thickness, based on the measured surface temperature and the measured irradiation time, an actual absorption measurement laser light emitting unit that irradiates the surface of the metal member that has the oxide film formed thereon with actual absorption measurement laser light through the oxide film, a reflected laser light output measuring unit that measures output of reflected laser light, or the actual absorption measurement laser light emitted from the actual absorption measurement laser light emitting unit and reflected from the surface, an actual absorption calculating unit that calculates actual absorption of the heating laser light by the surface of the metal member that has the oxide film formed thereon, based on a magnitude of the output of the reflected laser light measured by the reflected laser light output measuring unit, and an oxide film formation laser light irradiation condition changing unit that changes the predetermined irradiation conditions with the oxide film formation laser light based on the estimated thickness, the actual absorption, and the relationship between the thickness of the oxide film and the absorption having the periodic profile.

* * * * *